(12) United States Patent
Iwakaji et al.

(10) Patent No.: US 12,550,347 B2
(45) Date of Patent: Feb. 10, 2026

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP); Ryohei Gejo, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 563 days.

(21) Appl. No.: 17/903,823

(22) Filed: Sep. 6, 2022

(65) Prior Publication Data

US 2023/0031686 A1 Feb. 2, 2023

(51) Int. Cl.
*H03K 17/567* (2006.01)
*H10D 12/00* (2025.01)
(Continued)

(52) U.S. Cl.
CPC ......... *H10D 12/481* (2025.01); *H03K 17/567* (2013.01); *H10D 62/109* (2025.01); *H10D 62/127* (2025.01); *H10D 62/393* (2025.01)

(58) Field of Classification Search
CPC .. H10D 12/481; H10D 62/109; H10D 62/127; H10D 62/393; H03K 17/567
See application file for complete search history.

(56) References Cited

U.S. PATENT DOCUMENTS

| 8,384,151 B2 | 2/2013 | Pfirsch |
| 2012/0286288 A1 | 11/2012 | Hussein et al. |

(Continued)

FOREIGN PATENT DOCUMENTS

| JP | 2012-238715 A | 12/2012 |
| JP | 5859319 B2 | 2/2016 |

(Continued)

OTHER PUBLICATIONS

T. Sakano, et al., "Ultra-Low Switching Loss Triple-Gate controlled IGBT", The 33rd International Symposium on Power Semiconductor Devices and ICs(ISPSD), 2021.

*Primary Examiner* — Jeff W Natalini
*Assistant Examiner* — Ian Isaac Degrasse
(74) *Attorney, Agent, or Firm* — Knobbe, Martens, Olson & Bear, LLP

(57) ABSTRACT

A semiconductor device according to an embodiment includes a first trench, a first gate electrode in the first trench, a second trench, a second gate electrode provided in the second trench, a third trench, a third gate electrode in the third trench, a first electrode pad electrically connected to the first gate electrode, a second electrode pad electrically connected to the second gate electrode, and a third electrode pad electrically connected to the third gate electrode, in which a thickness of a conductive semiconductor region opposed to the third gate electrode is smaller than a thickness of a conductive semiconductor region opposed to the first gate electrode, and in which the thickness of the conductive semiconductor region opposed to the third gate electrode is smaller than a thickness of a conductive type semiconductor region opposed to the second gate electrode.

20 Claims, 16 Drawing Sheets

(51) Int. Cl.
*H10D 62/10* (2025.01)
*H10D 62/17* (2025.01)

(56) References Cited

U.S. PATENT DOCUMENTS

| | | |
|---|---|---|
| 2019/0237545 A1 | 8/2019 | Suzuki |
| 2020/0083192 A1* | 3/2020 | Suzuki .................... H01L 25/18 |
| 2020/0083879 A1 | 3/2020 | Tanaka et al. |
| 2020/0258983 A1* | 8/2020 | Yuan .................... H10D 64/513 |
| 2020/0303525 A1* | 9/2020 | Iwakaji ................ H10D 64/516 |
| 2020/0303527 A1* | 9/2020 | Matsudai ............... H03K 17/16 |
| 2020/0357903 A1 | 11/2020 | Kubouchi |
| 2021/0036135 A1* | 2/2021 | Liu ....................... H10D 62/393 |
| 2021/0091072 A1* | 3/2021 | Matsudai ............. H03K 17/567 |
| 2021/0281258 A1 | 9/2021 | Sakano et al. |
| 2021/0288143 A1 | 9/2021 | Iwakaji et al. |
| 2022/0085190 A1 | 3/2022 | Matsudai et al. |

FOREIGN PATENT DOCUMENTS

| | | |
|---|---|---|
| JP | 2016-092163 A | 5/2016 |
| JP | 2019-134069 A | 8/2019 |
| JP | 2020-155582 A | 9/2020 |
| JP | 2020-161786 A | 10/2020 |
| JP | 2021-141304 A | 9/2021 |
| JP | 2021-145077 A | 9/2021 |
| JP | 2022-049611 A | 3/2022 |
| WO | WO 2018/109794 A1 | 6/2018 |
| WO | WO 2020/036015 A1 | 2/2020 |

* cited by examiner

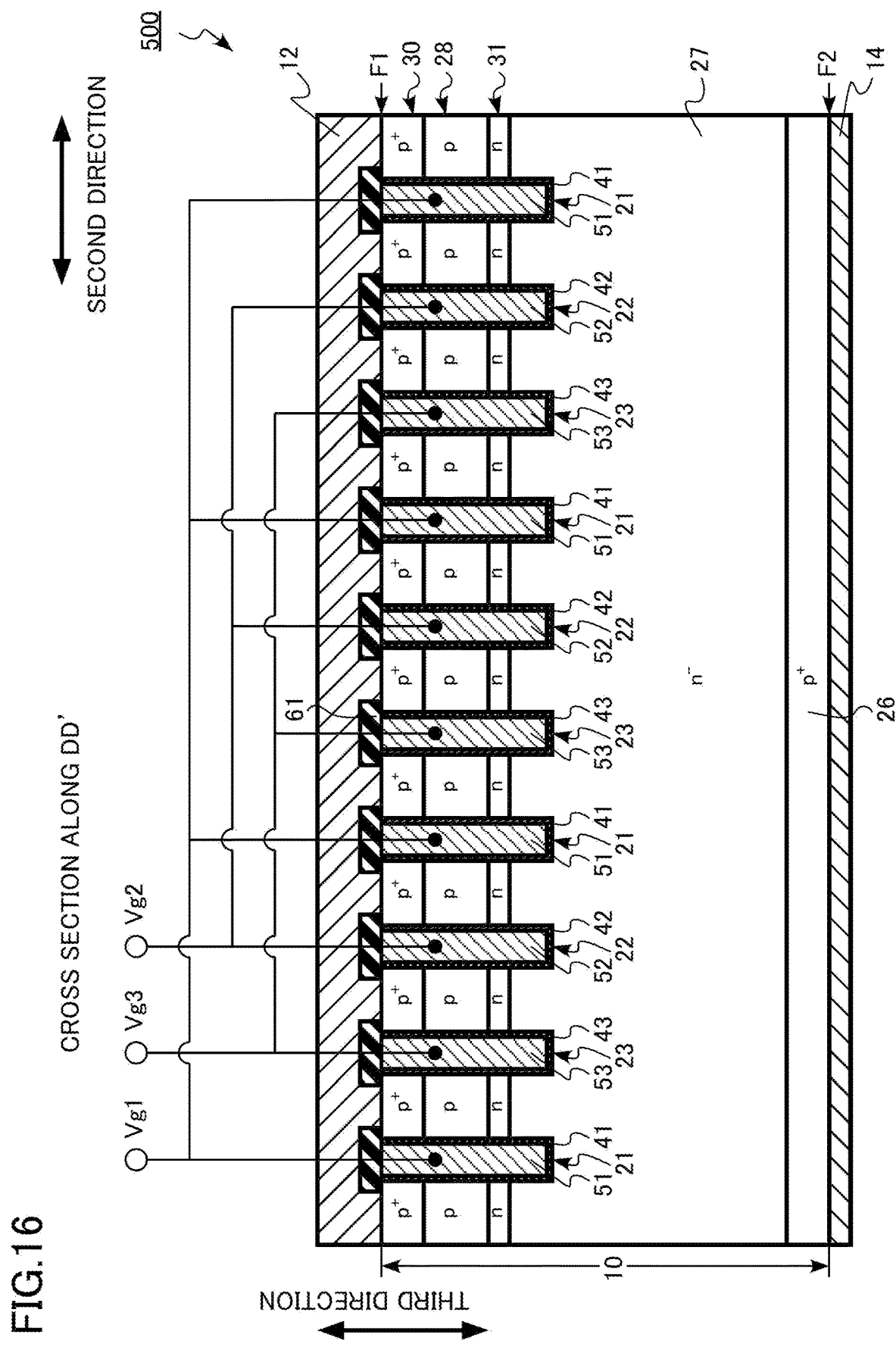

US 12,550,347 B2

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2022-044755, filed on Mar. 19, 2022, the entire contents of which are incorporated herein by reference.

FIELD

Embodiments described herein relate generally to a semiconductor device and a semiconductor circuit.

BACKGROUND

An insulated gate bipolar transistor (IGBT) is one example of a power semiconductor device. In the IGBT, for example, a p-type collector region, an n-type drift region, and a p-type base region are provided on a collector electrode. A gate electrode is provided in a trench penetrating the p-type base region and reaching the n-type drift region with a gate insulating film interposed between the gate electrode and the trench. Furthermore, an n-type emitter region connected to an emitter electrode is provided in a region adjacent to the trench on the surface of the p-type base region.

In the IGBT, there is a demand to reduce the switching loss.

BRIEF DESCRIPTION OF THE DRAWINGS

FIG. 16 is a schematic cross-sectional view of a part of the semiconductor device according to the fifth embodiment.

DETAILED DESCRIPTION

Figure 1:
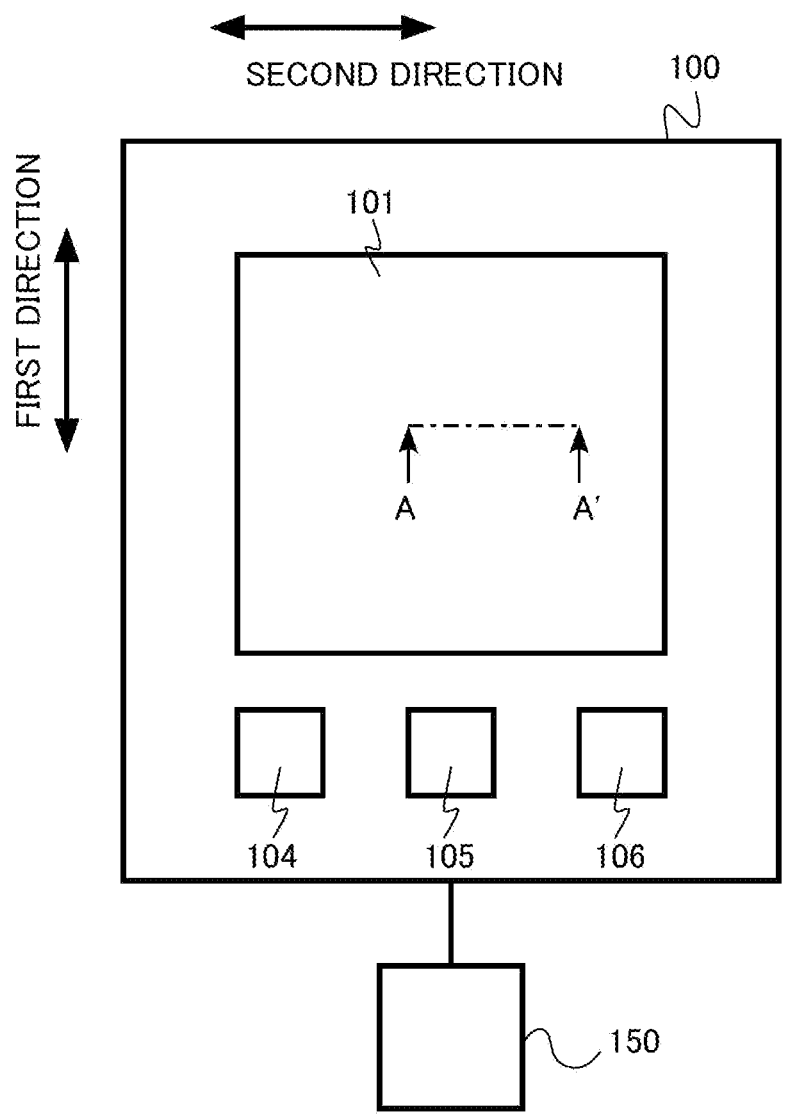
FIG. 1 is a schematic diagram of a semiconductor circuit according to a first embodiment.

A semiconductor device according to an embodiment includes a semiconductor layer including a first face and a second face opposed to the first face, a first semiconductor region of a first conductivity type provided in the semiconductor layer, a second semiconductor region of a second conductivity type provided in the semiconductor layer and provided between the first semiconductor region and the first face, a third semiconductor region of the first conductivity type provided in the semiconductor layer and provided between the second semiconductor region and the first face, a fourth semiconductor region of the second conductivity type provided in the semiconductor layer and provided between the third semiconductor region and the first face, a first trench provided in the semiconductor layer on a side of the first face and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided in the semiconductor layer on the side of the first face and in contact with the second semiconductor region, the third semiconductor region, and the fourth semiconductor region, a second gate electrode provided in the second trench, a second gate insulating film provided between the second gate electrode and the second semiconductor region, between the second gate electrode and the third semiconductor region, and between the second gate electrode and the fourth semiconductor region, at least one third trench provided in the semiconductor layer on the side of the first face and in contact with the second semiconductor region, the third semiconductor region, and the fourth semiconductor region, a third gate electrode provided in the at least one third trench, a third gate insulating film provided between the third gate electrode and the second semiconductor region, between the third gate electrode and the third semiconductor region, and between the third gate electrode and the fourth semiconductor region, a first electrode provided on the semiconductor layer on the side of the first face and in contact with the fourth semiconductor region, a second electrode provided on the semiconductor layer on a side of the second face and in contact with the first semiconductor region, a first electrode pad provided on the semiconductor layer on the side of the first face and electrically connected to the first gate electrode, a second electrode pad provided on the semiconductor layer on the side of the first face and electrically connected to the second gate electrode, and a third electrode pad provided on the semiconductor layer on the side of the first face and electrically connected to the third gate electrode. The third semiconductor region includes a first portion in contact with the first trench, a second portion in contact with the second trench, and a third portion in contact with the at least one third trench. A thickness of the third portion in a direction from the first face toward the second face is smaller than a thickness of the first portion in the direction. The thickness of the third portion in the direction from the first face toward the second face is smaller than a thickness of the second portion in the direction.

Hereinbelow, embodiments of the present disclosure will be described with reference to the drawings. Note that, in the following description, similar or identical members are labeled with the same reference signs, and description of the member or the like described once is omitted as appropriate.

In the present specification, in a case where there are notations of $n^+$-type, n-type, and $n^-$-type, it means that the n-type impurity concentration is lower in the order of $n^+$-type, n-type, and $n^-$-type. Also, in a case where there are notations of $p^+$-type, p-type, and $p^-$-type, it means that the p-type impurity concentration is lower in the order of $p^+$-type, p-type, and $p^-$-type. The $n^+$-type, the n-type, and the $n^-$-type may collectively be referred to simply as the n-type. Also, the $p^+$-type, the p-type, and the $p^-$-type may collectively be referred to simply as the p-type.

In the present specification, the n-type impurity concentration does not indicate an actual n-type impurity concentration, but indicates an effective n-type impurity concentration after compensation. Similarly, the p-type impurity concentration does not indicate an actual p-type impurity concentration, but indicates an effective p-type impurity concentration after compensation. For example, in a case where the actual n-type impurity concentration is higher than the actual p-type impurity concentration, the concentration obtained by subtracting the actual p-type impurity concentration from the actual n-type impurity concentration is defined as the n-type impurity concentration. The same applies to the p-type impurity concentration.

In the present specification, the distribution and absolute value of the impurity concentration of a semiconductor region can be measured using, for example, secondary ion mass spectrometry (SIMS). Also, the relative magnitude relationship between the impurity concentrations of two semiconductor regions can be identified using, for example, scanning capacitance microscopy (SCM). Also, the distribution and absolute value of the impurity concentration can be measured using, for example, spreading resistance analysis (SRA). In the SCM and the SRA, the relative magnitude relationship between the carrier concentrations of semiconductor regions and the absolute values of the carrier concentrations are obtained. By assuming the activation rate of impurities, it is possible to obtain the relative magnitude relationship between the impurity concentrations of two semiconductor regions, the distributions of the impurity concentrations, and the absolute values of the impurity concentrations from the measurement results of the SCM and the SRA.

In the present specification, a transistor portion driven using a first gate electrode in a semiconductor device may be referred to as a "first transistor having a first gate electrode". Similarly, a transistor portion driven using a second gate electrode may be referred to as a "second transistor having a second gate electrode", and a transistor portion driven using a third gate electrode may be referred to as a "third transistor having a third gate electrode".

First Embodiment

A semiconductor device according to a first embodiment includes a semiconductor layer including a first face and a second face opposed to the first face, a first semiconductor region of a first conductivity type provided in the semiconductor layer, a second semiconductor region of a second conductivity type provided in the semiconductor layer and provided between the first semiconductor region and the first face, a third semiconductor region of the first conductivity type provided in the semiconductor layer and provided between the second semiconductor region and the first face, a fourth semiconductor region of the second conductivity type provided in the semiconductor layer and provided between the third semiconductor region and the first face, a first trench provided in the semiconductor layer on a side of the first face and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided in the semiconductor layer on the side of the first face and in contact with the second semiconductor region, the third semiconductor region, and the fourth semiconductor region, a second gate electrode provided in the second trench, a second gate insulating film provided between the second gate electrode and the second semiconductor region, between the second gate electrode and the third semiconductor region, and between the second gate electrode and the fourth semiconductor region, at least one third trench provided in the semiconductor layer on the side of the first face and in contact with the second semiconductor region, the third semiconductor region, and the fourth semiconductor region, a third gate electrode provided in the at least one third trench, a third gate insulating film provided between the third gate electrode and the second semiconductor region, between the third gate electrode and the third semiconductor region, and between the third gate electrode and the fourth semiconductor region, a first electrode provided on the semiconductor layer on the side of the first face and in contact with the fourth semiconductor region, a second electrode provided on the semiconductor layer on a side of the second face and in contact with the first semiconductor region, a first electrode pad provided on the semiconductor layer on the side of the first face and electrically connected to the first gate electrode, a second electrode pad provided on the semiconductor layer on the side of the first face and electrically connected to the second gate electrode, and a third electrode pad provided on the semiconductor layer on the side of the first face and electrically connected to the third gate electrode. The third semiconductor region includes a first portion in contact with the first trench, a second portion in contact with the second trench, and a third portion in contact with the at least one third trench. A thickness of the third portion in a direction from the first face toward the second face is smaller than a thickness of the first portion in the direction. The thickness of the third portion in the direction from the first face toward the second face is smaller than a thickness of the second portion in the direction.

A semiconductor circuit according to the first embodiment includes a control circuit that drives the aforementioned semiconductor device.

The semiconductor device according to the first embodiment is an IGBT 100. The IGBT 100 is a trench gate type IGBT including a gate electrode in a trench formed in a semiconductor layer. Hereinbelow, a case where the first conductivity type is p-type and the second conductivity type is n-type will be described as an example.

The control circuit according to the first embodiment is a gate driver circuit 150. The semiconductor circuit according to the first embodiment includes a semiconductor device and a control circuit that controls the semiconductor device. The semiconductor circuit is, for example, a semiconductor module on which the IGBT 100 and the gate driver circuit 150 are implemented.

FIG. 1 is a schematic diagram of the semiconductor circuit according to the first embodiment.

Figure 2:
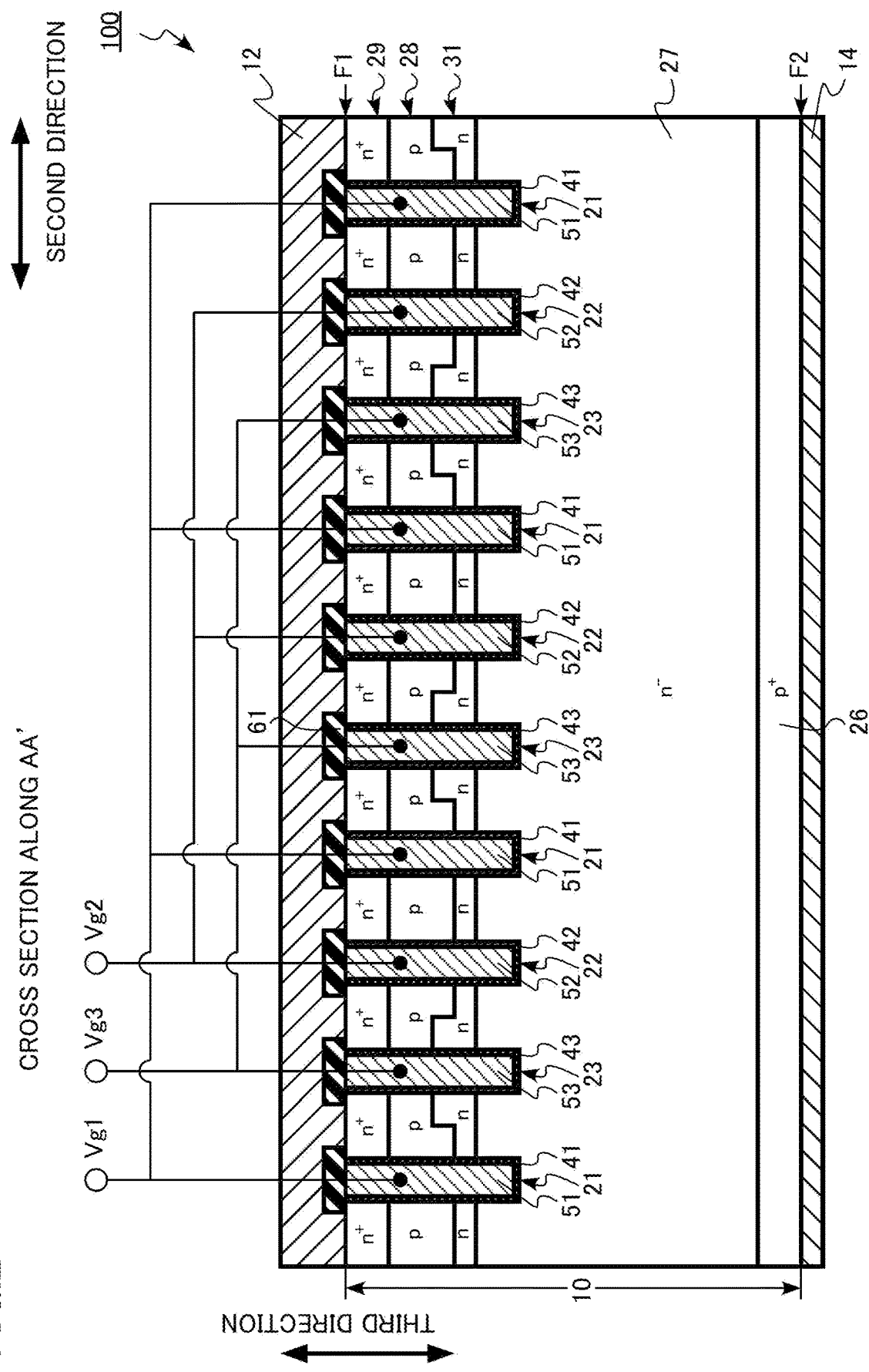
FIG. 2 is a schematic cross-sectional view of a part of a semiconductor device according to the first embodiment.

FIG. 2 is a schematic cross-sectional view of a part of the semiconductor device according to the first embodiment. FIG. 2 is a cross section taken along line AA' in FIG. 1.

Figure 3:
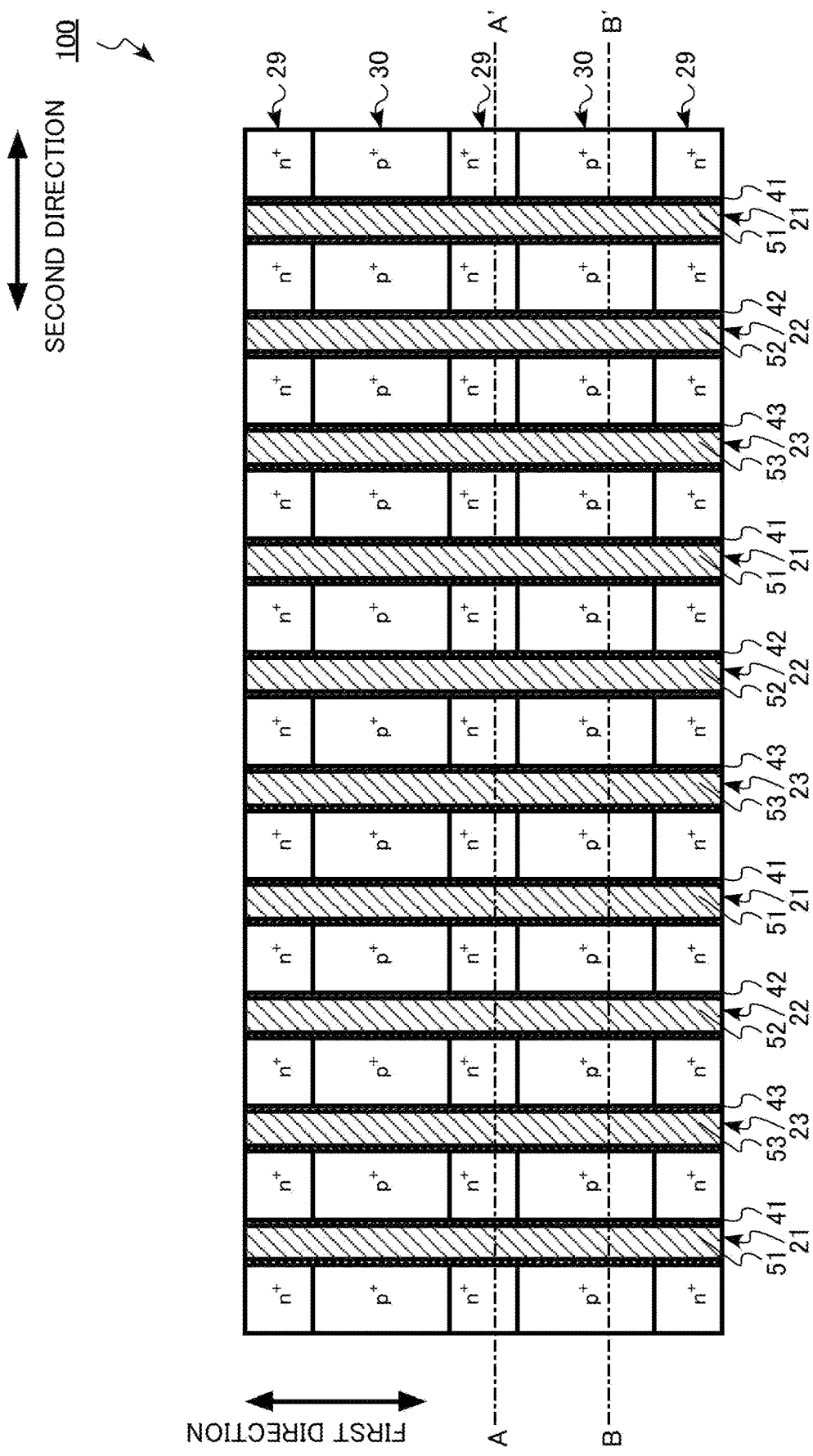
FIG. 3 is a schematic top view of a part of the semiconductor device according to the first embodiment.

FIG. 3 is a schematic top view of a part of the semiconductor device according to the first embodiment. FIG. 3 is a top view of a first face F1. FIG. 2 is a cross section taken along line AA' in FIG. 3.

Figure 4:
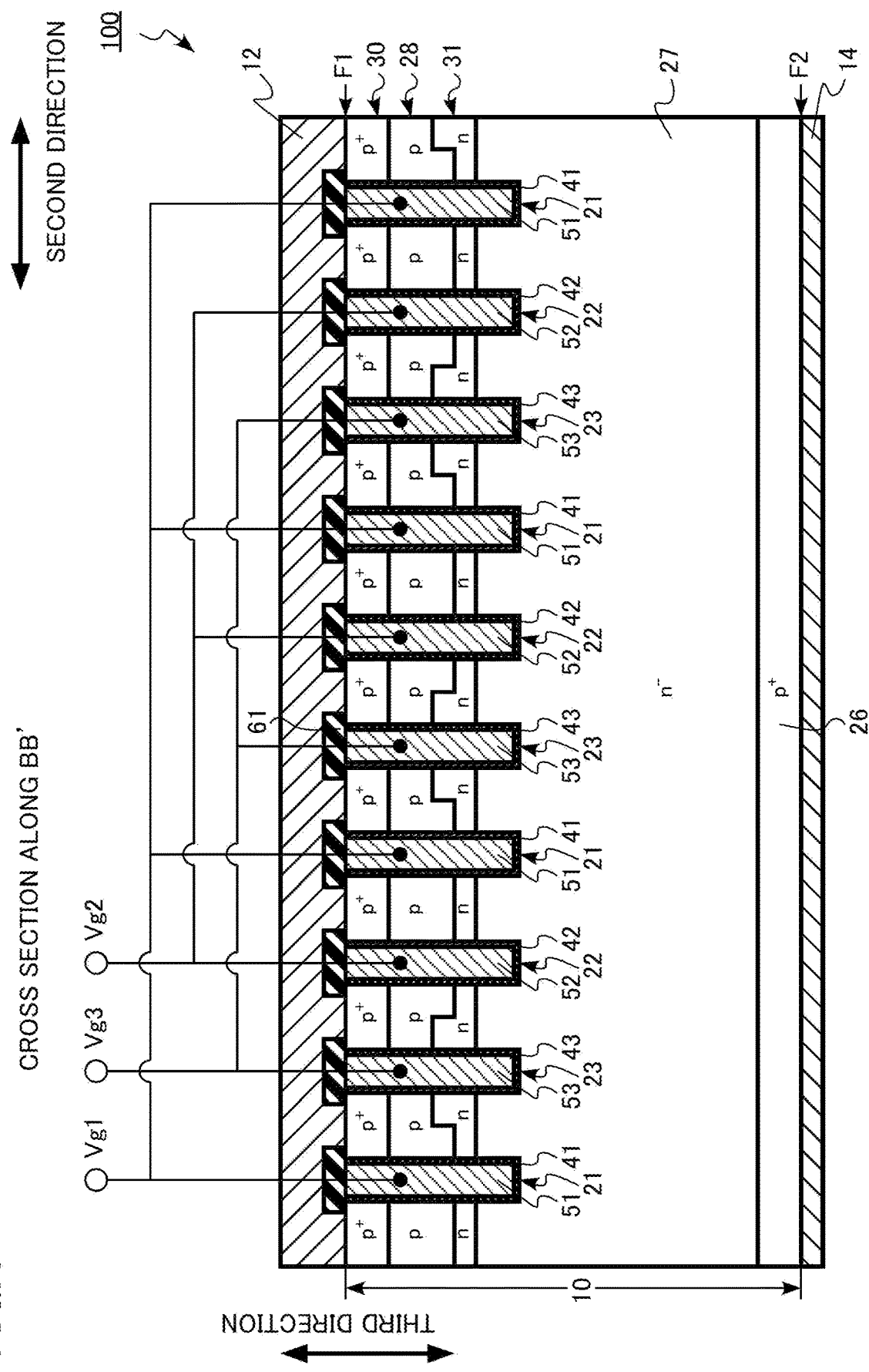
FIG. 4 is a schematic cross-sectional view of a part of the semiconductor device according to the first embodiment.

FIG. 4 is a schematic cross-sectional view of a part of the semiconductor device according to the first embodiment. FIG. 4 is a cross section taken along line BB' in FIG. 3.

The semiconductor circuit according to the first embodiment includes the IGBT 100 and the gate driver circuit 150. The IGBT 100 includes a transistor region 101. The transistor region 101 is provided with a plurality of transistors that operate at different times.

The IGBT 100 is an example of a semiconductor device. The gate driver circuit 150 is an example of a control circuit.

The IGBT 100 according to the first embodiment includes a semiconductor layer 10, an emitter electrode 12 (first electrode), a collector electrode 14 (second electrode), a first gate insulating film 41, a second gate insulating film 42, a third gate insulating film 43, a first gate electrode 51, a second gate electrode 52, a third gate electrode 53, an interlayer insulating layer 61, a first gate electrode pad 104 (first electrode pad), a second gate electrode pad 105 (second electrode pad), and a third gate electrode pad 106 (third electrode pad).

In the semiconductor layer 10, a first gate trench 21 (first trench), a second gate trench 22 (second trench), a third gate trench 23 (third trench), a collector region 26 (first semiconductor region), a drift region 27 (second semiconductor region), a base region 28 (third semiconductor region), an emitter region 29 (fourth semiconductor region), a contact region 30, and a barrier region 31 (fifth semiconductor region) are provided.

The base region 28 includes a first portion 28a, a second portion 28b, and a third portion 28c. The barrier region 31 includes a fourth portion 31a, a fifth portion 31b, and a sixth portion 31c.

The semiconductor layer 10 includes the first face F1 and a second face F2 opposed to the first face F1. The semiconductor layer 10 is, for example, single crystal silicon. The film thickness of the semiconductor layer 10 is, for example, equal to or more than 40 μm and equal to or less than 700 μm.

In the present specification, one direction parallel to the first face F1 is referred to as a first direction. Also, a direction parallel to the first face F1 and orthogonal to the first direction is referred to as a second direction. Also, a direction from the first face F1 toward the second face F2 is referred to as a third direction.

Also, in the present specification, the "depth" is defined as a distance in a direction toward the second face F2 with reference to the first face F1.

The emitter electrode 12 is provided on a side of the semiconductor layer 10 provided with the first face F1. At least a part of the emitter electrode 12 is in contact with the first face F1 of the semiconductor layer 10. The emitter electrode 12 is, for example, a metal.

The emitter electrode 12 is in contact with the emitter region 29. The emitter electrode 12 is electrically connected to the emitter region 29.

The emitter electrode 12 is in contact with the contact region 30. The emitter electrode 12 is electrically connected to the contact region 30. The emitter electrode 12 is electrically connected to the base region 28 via the contact region 30.

The collector electrode 14 is provided on a side of the semiconductor layer 10 provided with the second face F2. At least a part of the collector electrode 14 is in contact with the second face F2 of the semiconductor layer 10. The collector electrode 14 is, for example, a metal.

The collector electrode 14 is in contact with the collector region 26. The collector electrode 14 is electrically connected to the collector region 26.

The collector region 26 is a p$^+$-type semiconductor region. The collector region 26 is in contact with the second face F2. The collector region 26 is electrically connected to the collector electrode 14. The collector region 26 is in contact with the collector electrode 14. The collector region 26 serves as a source for supplying holes when the IGBT 100 is in the on state.

The drift region 27 is an n$^-$-type semiconductor region. The drift region 27 is provided between the collector region 26 and the first face F1.

The drift region 27 serves as a path of an on-current when the IGBT 100 is in the on state. The drift region 27 has a function of being depleted and maintaining the breakdown voltage of the IGBT 100 when the IGBT 100 is in the off state.

The base region 28 is a p-type semiconductor region. The base region 28 is provided between the drift region 27 and the first face F1. The drift region 27 is sandwiched between the base region 28 and the collector region 26.

The depth of the base region 28 is, for example, equal to or less than 5 μm. N-type inversion layers are formed in a region of the base region 28 opposed to the first gate electrode 51, a region of the base region 28 opposed to the second gate electrode 52, and a region of the base region 28 opposed to the third gate electrode 53 when the IGBT 100 is in the on state. The base region 28 functions as a channel region of a transistor.

The barrier region 31 is an n-type semiconductor region. The barrier region 31 is provided between the drift region 27 and the base region 28. The n-type impurity concentration of the barrier region 31 is higher than the n-type impurity concentration of the drift region 27.

The barrier region 31 has a function of increasing the carrier storage amount in the drift region 27 when the IGBT 100 is in the on state. By providing the barrier region 31, the on-resistance of the IGBT 100 is lowered, and the steady loss of the IGBT 100 is reduced.

The emitter region 29 is an n$^+$-type semiconductor region. The emitter region 29 is provided between the base region 28 and the first face F1.

The emitter region 29 is in contact with the first gate insulating film 41, the second gate insulating film 42, and the third gate insulating film 43.

The n-type impurity concentration of the emitter region 29 is higher than the n-type impurity concentration of the drift region 27.

The emitter region 29 is in contact with the emitter electrode 12. The emitter region 29 is electrically connected to the emitter electrode 12. The emitter region 29 serves as a source for supplying electrons when the IGBT 100 is in the on state.

The contact region 30 is a p⁺-type semiconductor region. The contact region 30 is provided between the base region 28 and the first face F1. The contact region 30 is in contact with the emitter electrode 12. The contact region 30 is electrically connected to the emitter electrode 12.

The p-type impurity concentration of the contact region 30 is higher than the p-type impurity concentration of the base region 28.

The first gate trench 21 is provided on a side of the semiconductor layer 10 provided with the first face F1. The first gate trench 21 is a trench provided in the semiconductor layer 10. The first gate trench 21 is a part of the semiconductor layer 10.

As illustrated in FIG. 3, the first gate trench 21 extends on the first face F1 in the first direction parallel to the first face F1. The first gate trench 21 is in a stripe shape. The plurality of first gate trenches 21 are repeatedly disposed in the second direction orthogonal to the first direction.

The first gate trench 21 is in contact with the drift region 27, the base region 28, the emitter region 29, and the barrier region 31. The first gate trench 21 penetrates the base region 28 and reaches the drift region 27. The depth of the first gate trench 21 is, for example, equal to or less than 8 μm.

The first gate electrode 51 is provided in the first gate trench 21. The first gate electrode 51 is, for example, a semiconductor or a metal. The first gate electrode 51 is, for example, amorphous silicon or polycrystalline silicon containing n-type impurities or p-type impurities. The first gate electrode 51 is electrically connected to the first gate electrode pad 104.

The first gate insulating film 41 is provided between the first gate electrode 51 and the semiconductor layer 10. The first gate insulating film 41 is provided between the first gate electrode 51 and the drift region 27, between the first gate electrode 51 and the base region 28, between the first gate electrode 51 and the emitter region 29, and between the first gate electrode 51 and the barrier region 31. The first gate insulating film 41 is in contact with the drift region 27, the base region 28, the emitter region 29, and the barrier region 31. The first gate insulating film 41 is, for example, silicon oxide.

The second gate trench 22 is provided on a side of the semiconductor layer 10 provided with the first face F1. The second gate trench 22 is a trench provided in the semiconductor layer 10. The second gate trench 22 is a part of the semiconductor layer 10.

As illustrated in FIG. 3, the second gate trench 22 extends on the first face F1 in the first direction parallel to the first face F1. The second gate trench 22 is in a stripe shape. The plurality of second gate trenches 22 are repeatedly disposed in the second direction orthogonal to the first direction.

The second gate trench 22 is in contact with the drift region 27, the base region 28, the emitter region 29, and the barrier region 31. The second gate trench 22 penetrates the base region 28 and reaches the drift region 27. The depth of the second gate trench 22 is, for example, equal to or less than 8 μm.

The second gate electrode 52 is provided in the second gate trench 22. The second gate electrode 52 is, for example, a semiconductor or a metal. The second gate electrode 52 is, for example, amorphous silicon or polycrystalline silicon containing n-type impurities or p-type impurities. The second gate electrode 52 is electrically connected to the second gate electrode pad 105.

The second gate insulating film 42 is provided between the second gate electrode 52 and the semiconductor layer 10. The second gate insulating film 42 is provided between the second gate electrode 52 and the drift region 27, between the second gate electrode 52 and the base region 28, between the second gate electrode 52 and the emitter region 29, and between the second gate electrode 52 and the barrier region 31. The second gate insulating film 42 is in contact with the drift region 27, the base region 28, the emitter region 29, and the barrier region 31. The second gate insulating film 42 is, for example, silicon oxide.

The third gate trench 23 is provided on a side of the semiconductor layer 10 provided with the first face F1. The third gate trench 23 is a trench provided in the semiconductor layer 10. The third gate trench 23 is a part of the semiconductor layer 10.

As illustrated in FIG. 3, the third gate trench 23 extends on the first face F1 in the first direction parallel to the first face F1. The third gate trench 23 is in a stripe shape. The plurality of third gate trenches 23 are repeatedly disposed in the second direction orthogonal to the first direction.

The third gate trench 23 is in contact with the drift region 27, the base region 28, the emitter region 29, and the barrier region 31. The third gate trench 23 penetrates the base region 28 and reaches the drift region 27. The depth of the third gate trench 23 is, for example, equal to or less than 8 μm.

The third gate electrode 53 is provided in the third gate trench 23. The third gate electrode 53 is, for example, a semiconductor or a metal. The third gate electrode 53 is, for example, amorphous silicon or polycrystalline silicon containing n-type impurities or p-type impurities. The third gate electrode 53 is electrically connected to the third gate electrode pad 106.

The third gate insulating film 43 is provided between the third gate electrode 53 and the semiconductor layer 10. The third gate insulating film 43 is provided between the third gate electrode 53 and the drift region 27, between the third gate electrode 53 and the base region 28, between the third gate electrode 53 and the emitter region 29, and between the third gate electrode 53 and the barrier region 31. The third gate insulating film 43 is in contact with the drift region 27, the base region 28, the emitter region 29, and the barrier region 31. The third gate insulating film 43 is, for example, silicon oxide.

The interlayer insulating layer 61 is provided between the first gate electrode 51 and the emitter electrode 12. The interlayer insulating layer 61 electrically isolates the first gate electrode 51 and the emitter electrode 12 from each other. The interlayer insulating layer 61 is provided between the second gate electrode 52 and the emitter electrode 12. The interlayer insulating layer 61 electrically isolates the second gate electrode 52 and the emitter electrode 12 from each other. The interlayer insulating layer 61 is provided between the third gate electrode 53 and the emitter electrode 12. The interlayer insulating layer 61 electrically isolates the third gate electrode 53 and the emitter electrode 12 from each other. The interlayer insulating layer 61 is, for example, silicon oxide.

The first gate electrode pad 104 is provided on a side of the semiconductor layer 10 provided with the first face F1. The first gate electrode pad 104 is electrically connected to the first gate electrode 51. The first gate electrode pad 104 and the first gate electrode 51 are connected by, for example, not-illustrated metal wiring.

A first gate voltage (Vg1) is applied to the first gate electrode pad 104.

For example, a first turn-on voltage (Von1) and a first turn-off voltage (Voff1) are applied to the first gate electrode pad 104.

The second gate electrode pad 105 is provided on a side of the semiconductor layer 10 provided with the first face F1. The second gate electrode pad 105 is electrically connected to the second gate electrode 52. The second gate electrode pad 105 and the second gate electrode 52 are connected by, for example, not-illustrated metal wiring.

A second gate voltage (Vg2) is applied to the second gate electrode pad 105. For example, a second turn-on voltage (Von2) and a second turn-off voltage (Voff2) are applied to the second gate electrode pad 105.

The third gate electrode pad 106 is provided on a side of the semiconductor layer 10 provided with the first face F1. The third gate electrode pad 106 is electrically connected to the third gate electrode 53. The third gate electrode pad 106 and the third gate electrode 53 are connected by, for example, not-illustrated metal wiring.

A third gate voltage (Vg3) is applied to the third gate electrode pad 106. For example, a third turn-on voltage (Von3) and a third turn-off voltage (Voff3) are applied to the third gate electrode pad 106.

The gate driver circuit 150 is provided, for example, on the same circuit board as the IGBT 100 or on another circuit board. The gate driver circuit 150 has a function of driving the IGBT 100.

The gate driver circuit 150 has a function of applying the desired first gate voltage (Vg1), the desired second gate voltage (Vg2), and the desired third gate voltage (Vg3) to the first gate electrode pad 104, the second gate electrode pad 105, and the third gate electrode pad 106 at desired times.

The gate driver circuit 150 applies the first turn-on voltage (Von1) to the first gate electrode pad 104, applies the second turn-on voltage (Von2) to the second gate electrode pad 105, and applies the third turn-on voltage (Von3) to the third gate electrode pad 106. After applying the first turn-on voltage (Von1) to the first gate electrode pad 104, applying the second turn-on voltage (Von2) to the second gate electrode pad 105, and applying the third turn-on voltage (Von3) to the third gate electrode pad 106, the gate driver circuit 150 applies the third turn-off voltage (Voff3) to the third gate electrode pad 106. After applying the third turn-off voltage (Voff3) to the third gate electrode pad 106, the gate driver circuit 150 applies the second turn-off voltage (Voff2) to the second gate electrode pad 105. After applying the second turn-off voltage (Voff2) to the second gate electrode pad 105, the gate driver circuit 150 applies the first turn-off voltage (Voff1) to the first gate electrode pad 104.

Figure 5:
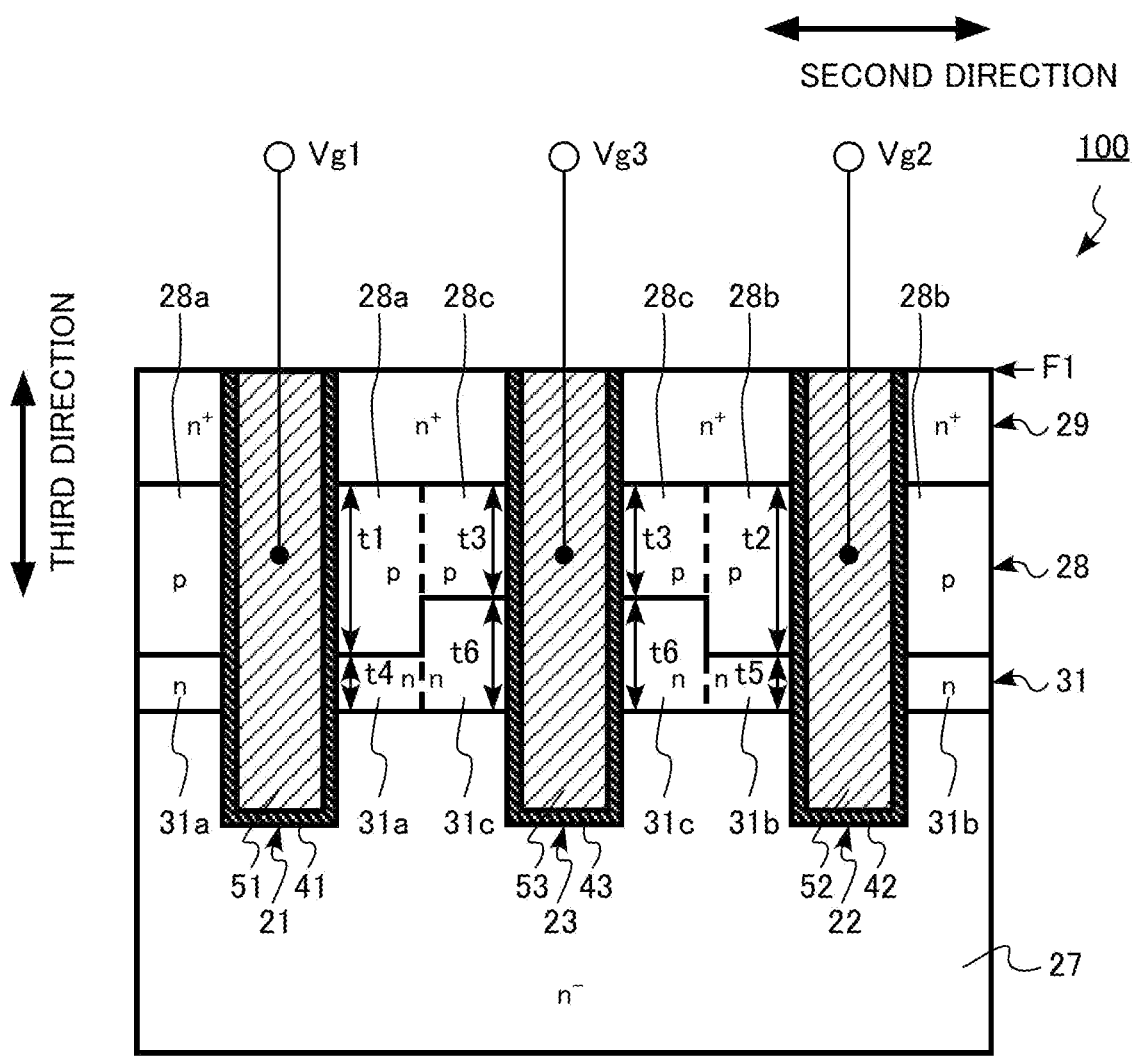
FIG. 5 is an enlarged schematic cross-sectional view of a part of the semiconductor device according to the first embodiment.

FIG. 5 is an enlarged schematic cross-sectional view of a part of the semiconductor device according to the first embodiment. FIG. 5 is an enlarged view of a part of FIG. 2.

As illustrated in FIG. 5, the base region 28 includes the first portion 28a, the second portion 28b, and the third portion 28c.

The first portion 28a is a portion of the base region 28 coming in contact with the first gate trench 21. The first portion 28a is in contact with the first gate insulating film 41. The first portion 28a is opposed to the first gate electrode 51.

The first portion 28a functions as a channel region of a first transistor having the first gate electrode 51, the first gate insulating film 41, and the first portion 28a. The first transistor is a transistor driven by the first gate voltage (Vg1) applied to the first gate electrode 51.

The second portion 28b is a portion of the base region 28 coming in contact with the second gate trench 22. The second portion 28b is in contact with the second gate insulating film 42. The second portion 28b is opposed to the second gate electrode 52.

The second portion 28b functions as a channel region of a second transistor having the second gate electrode 52, the second gate insulating film 42, and the second portion 28b. The second transistor is a transistor driven by the second gate voltage (Vg2) applied to the second gate electrode 52.

The third portion 28c is a portion of the base region 28 coming in contact with the third gate trench 23. The third portion 28c is in contact with the third gate insulating film 43. The third portion 28c is opposed to the third gate electrode 53.

The third portion 28c functions as a channel region of a third transistor having the third gate electrode 53, the third gate insulating film 43, and the third portion 28c. The third transistor is a transistor driven by the third gate voltage (Vg3) applied to the third gate electrode 53.

The thickness (t3 in FIG. 5) of the third portion 28c in the third direction is smaller than the thickness (t1 in FIG. 5) of the first portion 28a in the third direction. The thickness t3 of the third portion 28c in the third direction is, for example, equal to or more than 20% or more and equal to or less than 70% of the thickness t1 of the first portion 28a in the third direction.

Also, the thickness (t3 in FIG. 5) of the third portion 28c in the third direction is smaller than the thickness (t2 in FIG. 5) of the second portion 28b in the third direction. The thickness t3 of the third portion 28c in the third direction is, for example, equal to or more than 20% or more and equal to or less than 70% of the thickness t2 of the second portion 28b in the third direction.

As illustrated in FIG. 5, the barrier region 31 includes the fourth portion 31a, the fifth portion 31b, and the sixth portion 31c.

The fourth portion 31a is a portion of the barrier region 31 coming in contact with the first gate trench 21. The fourth portion 31a is in contact with the first gate insulating film 41. The fourth portion 31a is opposed to the first gate electrode 51. The fourth portion 31a is provided between the drift region 27 and the first portion 28a.

The fifth portion 31b is a portion of the barrier region 31 coming in contact with the second gate trench 22. The fifth portion 31b is in contact with the second gate insulating film 42. The fifth portion 31b is opposed to the second gate electrode 52. The fifth portion 31b is provided between the drift region 27 and the second portion 28b.

The sixth portion 31c is a portion of the barrier region 31 coming in contact with the third gate trench 23. The sixth portion 31c is in contact with the third gate insulating film 43. The sixth portion 31c is opposed to the third gate electrode 53. The sixth portion 31c is provided between the drift region 27 and the third portion 28c.

The thickness (t6 in FIG. 5) of the sixth portion 31c in the third direction is larger than the thickness (t4 in FIG. 5) of the fourth portion 31a in the third direction. The thickness t6 of the sixth portion 31c in the third direction is, for example, equal to or more than 150% of the thickness t4 of the fourth portion 31a in the third direction.

The thickness (t6 in FIG. 5) of the sixth portion 31c in the third direction is larger than the thickness (t5 in FIG. 5) of the fifth portion 31b in the third direction. The thickness t6 of the sixth portion 31c in the third direction is, for example, equal to or more than 150% of the thickness t5 of the fifth portion 31b in the third direction.

Next, an example of a method for driving the IGBT 100 will be described.

Figure 6:
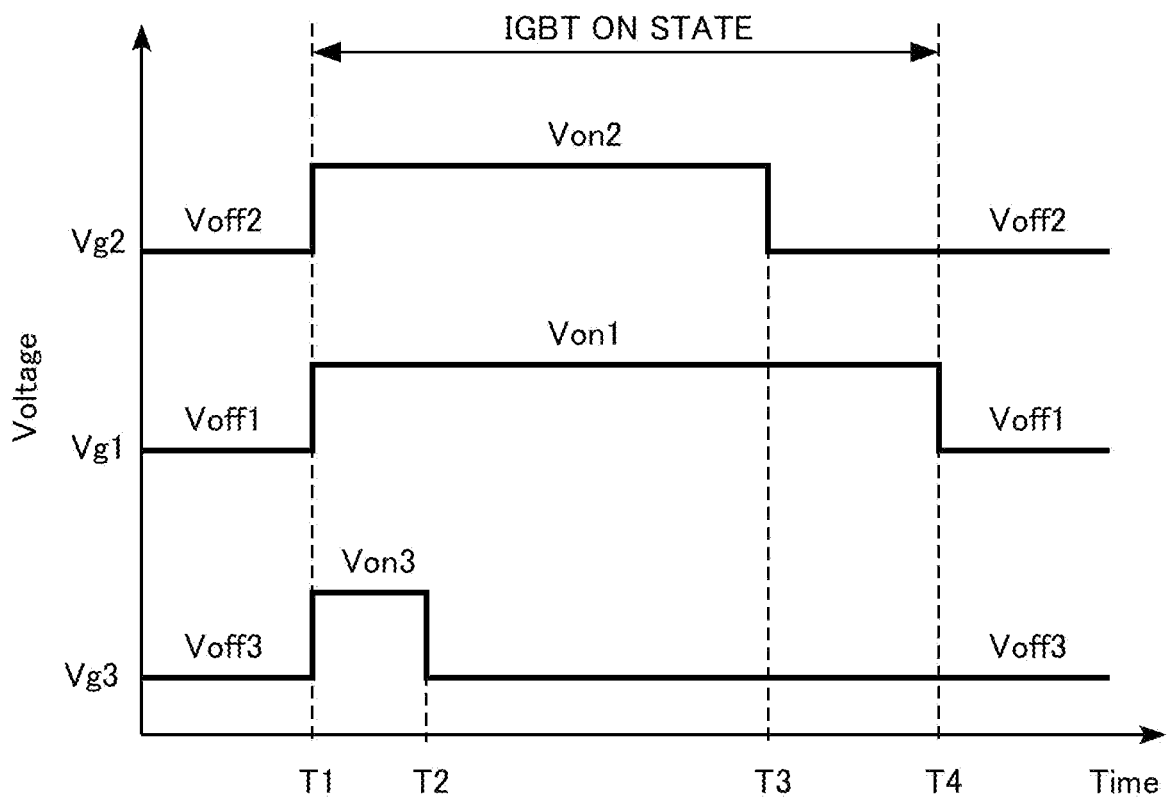
FIG. 6 is an explanatory diagram of a method for driving the semiconductor device according to the first embodiment.

FIG. 6 is an explanatory diagram of a method for driving the semiconductor device according to the first embodiment. FIG. 6 is a timing chart of the first gate voltage (Vg1)

applied to the first gate electrode pad 104, the second gate voltage (Vg2) applied to the second gate electrode pad 105, and the third gate voltage (Vg3) applied to the third gate electrode pad 106.

In the off state of the IGBT 100, an emitter voltage is applied to the emitter electrode 12, for example. The emitter voltage is, for example, 0 V. A collector voltage is applied to the collector electrode 14. The collector voltage is, for example, equal to or more than 200 V and equal to or less than 6500 V.

In the off state of the IGBT 100, the first turn-off voltage (Voff1) is applied to the first gate electrode pad 104. The first gate voltage (Vg1) is the first turn-off voltage (Voff1). Therefore, the first turn-off voltage (Voff1) is applied to the first gate electrode 51 as well.

The first turn-off voltage (Voff1) is a voltage less than a threshold voltage at which the first transistor having the first gate electrode 51 is not turned on, and is, for example, 0 V or a negative voltage.

In the off state, the n-type inversion layer is not formed in the base region 28 opposed to the first gate electrode 51 and coming in contact with the first gate insulating film 41.

In the off state of the IGBT 100, the second turn-off voltage (Voff2) is applied to the second gate electrode pad 105. The second gate voltage (Vg2) is the second turn-off voltage (Voff2). Therefore, the second turn-off voltage (Voff2) is applied to the second gate electrode 52 as well.

The second turn-off voltage (Voff2) is a voltage less than a threshold voltage at which the second transistor having the second gate electrode 52 is not turned on, and is, for example, 0 V or a negative voltage.

In the off state, the n-type inversion layer is not formed in the base region 28 opposed to the second gate electrode 52 and coming in contact with the second gate insulating film 42.

In the off state of the IGBT 100, the third turn-off voltage (Voff3) is applied to the third gate electrode pad 106. The third gate voltage (Vg3) is the third turn-off voltage (Voff3). Therefore, the third turn-off voltage (Voff3) is applied to the third gate electrode 53 as well.

The third turn-off voltage (Voff3) is a voltage less than a threshold voltage at which the third transistor having the third gate electrode 53 is not turned on, and is, for example, 0 V.

In the off state, the n-type inversion layer is not formed in the base region 28 opposed to the third gate electrode 53 and coming in contact with the third gate insulating film 43.

At time T1, the first turn-on voltage (Von1) is applied to the first gate electrode pad 104. The first gate voltage (Vg1) is the first turn-on voltage (Von1). The first turn-on voltage (Von1) is applied to the first gate electrode 51 as well.

The first turn-on voltage (Von1) is a positive voltage more than a threshold voltage of the first transistor having the first gate electrode 51. The first turn-on voltage (Von1) is, for example, 15 V. As a result of applying the first turn-on voltage (Von1) to the first gate electrode 51, the first transistor having the first gate electrode 51 is turned on.

In the on state, the n-type inversion layer is formed in the base region 28 opposed to the first gate electrode 51 and coming in contact with the first gate insulating film 41.

At time T1, the second turn-on voltage (Von2) is applied to the second gate electrode pad 105. The second gate voltage (Vg2) is the second turn-on voltage (Von2). The second turn-on voltage (Von2) is applied to the second gate electrode 52 as well.

The second turn-on voltage (Von2) is a positive voltage more than a threshold voltage of the second transistor having the second gate electrode 52. The second turn-on voltage (Von2) is, for example, 15 V. As a result of applying the second turn-on voltage (Von2) to the second gate electrode 52, the second transistor having the second gate electrode 52 is turned on.

In the on state, the n-type inversion layer is formed in the base region 28 opposed to the second gate electrode 52 and coming in contact with the second gate insulating film 42.

At time T1, the third turn-on voltage (Von3) is applied to the third gate electrode pad 106. The third gate voltage (Vg3) is the third turn-on voltage (Von3). The third turn-on voltage (Von3) is applied to the third gate electrode 53 as well.

The third turn-on voltage (Von3) is a positive voltage more than a threshold voltage of the third transistor having the third gate electrode 53. The third turn-on voltage (Von3) is, for example, 15 V. As a result of applying the third turn-on voltage (Von3) to the third gate electrode 53, the third transistor having the third gate electrode 53 is turned on.

In the on state, the n-type inversion layer is formed in the base region 28 opposed to the third gate electrode 53 and coming in contact with the third gate insulating film 43.

At and after time T1, the IGBT 100 is in the on state.

At time T2, the third turn-off voltage (Voff3) is applied to the third gate electrode pad 106. The third gate voltage (Vg3) is the third turn-off voltage (Voff3). The third turn-off voltage (Voff3) is applied to the third gate electrode 53 as well.

As a result of applying the third turn-off voltage (Voff3) to the third gate electrode 53, the third transistor having the third gate electrode 53 is turned off.

At time T3, the second turn-off voltage (Voff2) is applied to the second gate electrode pad 105. The second gate voltage (Vg2) is the second turn-off voltage (Voff2). The second turn-off voltage (Voff2) is applied to the second gate electrode 52 as well.

As a result of applying the second turn-off voltage (Voff2) to the second gate electrode 52, the second transistor having the second gate electrode 52 is turned off.

For example, in a case where the second turn-off voltage (Voff2) is a negative voltage, a p-type inversion layer is formed in the drift region 27 coming in contact with the second gate insulating film 42. The second turn-off voltage (Voff2) is, for example, equal to or more than −15 V and less than 0 V.

At time T4, the first turn-off voltage (Voff1) is applied to the first gate electrode pad 104. The first gate voltage (Vg1) is the first turn-off voltage (Voff1). The first turn-off voltage (Voff1) is applied to the first gate electrode 51 as well.

As a result of applying the first turn-off voltage (Voff1) to the first gate electrode 51, the first transistor having the first gate electrode 51 is turned off.

At and after time T4, all of the first transistor having the first gate electrode 51, the second transistor having the second gate electrode 52, and the third transistor having the third gate electrode 53 are in the off state.

Next, functions and effects of the semiconductor device and the semiconductor circuit according to the first embodiment will be described.

The IGBT 100 according to the first embodiment includes, in the transistor region 101, the first transistor having the first gate electrode 51, the second transistor having the second gate electrode 52, and the third transistor having the third gate electrode 53. The respective transistors can be driven independently. With this configuration, the turn-on loss and the turn-off loss of the IGBT 100 can be reduced.

At time T1, all of the first transistor having the first gate electrode 51, the second transistor having the second gate electrode 52, and the third transistor having the third gate electrode 53 are turned on. When all of the first transistor having the first gate electrode 51, the second transistor having the second gate electrode 52, and the third transistor having the third gate electrode 53 are turned on, electrons are injected from the emitter region 29 into the drift region 27 in the transistor region 101. In response to it, holes are injected from the collector region 26 into the drift region 27.

For example, the amount of electrons injected from the emitter region 29 into the drift region 27 is larger than in a case where the third transistor having the third gate electrode 53 is not provided. Therefore, the turn-on time of the IGBT 100 can be shortened. Consequently, the turn-on loss of the IGBT 100 is reduced.

At time T2, the third transistor having the third gate electrode 53 is turned off. At time T2, injection of electrons into the drift region 27 by the third transistor having the third gate electrode 53 is stopped. At and after time T2, the third transistor having the third gate electrode 53 functions as a dummy gate.

When injection of electrons into the drift region 27 by the third transistor having the third gate electrode 53 is stopped, the carrier concentration of the drift region 27 on a side provided with the emitter region 29 is lowered. Therefore, the saturation current of the IGBT 100 can be suppressed. Consequently, for example, the short circuit withstand time of the IGBT 100 is improved.

At time T3, the second transistor having the second gate electrode 52 is turned off. Thereafter, at time T4, the first transistor having the first gate electrode 51 is turned off. At time T4, the IGBT 100 is in the off state.

By turning off the second transistor having the second gate electrode 52 at time T3, the carrier concentration of the drift region 27 is lowered. Hence, the amount of carriers to be discharged after the first transistor having the first gate electrode 51 is turned off is reduced.

Therefore, the turn-off time of the IGBT 100 can be shortened. Consequently, the turn-off loss of the IGBT 100 is reduced.

In particular, in a case where the second turn-off voltage (Voff2) applied to the second gate electrode 52 is a negative voltage, the p-type inversion layer is formed in the drift region 27 coming in contact with the second gate insulating film 42. Therefore, discharge of holes from the drift region 27 to the emitter electrode 12 is facilitated until time T4, and the amount of carriers to be discharged after the first transistor having the first gate electrode 51 is turned off is further reduced. Consequently, the turn-off loss of the IGBT 100 is further reduced.

In the IGBT 100 according to the first embodiment, the thickness (t3 in FIG. 5) of the third portion 28c of the base region 28 in the third direction is smaller than the thickness (t1 in FIG. 5) of the first portion 28a in the third direction. Therefore, the channel length of the third transistor having the third gate electrode 53 is shorter than the channel length of the first transistor having the first gate electrode 51. Therefore, the threshold voltage of the third transistor having the third gate electrode 53 is lower than the threshold voltage of the first transistor having the first gate electrode 51 due to the short channel effect.

Also, in the IGBT 100 according to the first embodiment, the thickness (t3 in FIG. 5) of the third portion 28c of the base region 28 in the third direction is smaller than the thickness (t2 in FIG. 5) of the second portion 28b in the third direction. Therefore, the channel length of the third transistor having the third gate electrode 53 is shorter than the channel length of the second transistor having the second gate electrode 52. Therefore, the threshold voltage of the second transistor having the second gate electrode 52 is lower than the threshold voltage of the second transistor having the second gate electrode 52 due to the short channel effect.

The threshold voltage of the third transistor having the third gate electrode 53 is lower than the threshold voltage of the first transistor having the first gate electrode 51 and the threshold voltage of the second transistor having the second gate electrode 52. Hence, for example, in a case where the turn-on voltage is applied to the first gate electrode 51, the second gate electrode 52, and the third gate electrode 53 at the same time at time T1, the third transistor having the third gate electrode 53 starts the turn-on operation earlier. Therefore, the amount of electrons injected into the drift region 27 increases quickly. Therefore, the turn-on time of the IGBT 100 can further be shortened. Consequently, the turn-on loss of the IGBT 100 is further reduced.

From the viewpoint of lowering the threshold voltage of the third transistor having the third gate electrode 53, the thickness t3 of the third portion 28c in the third direction is preferably equal to or less than 70%, more preferably equal to or less than 50%, of the thickness t1 of the first portion 28a in the third direction. From the viewpoint of lowering the threshold voltage of the third transistor having the third gate electrode 53, the thickness t3 of the third portion 28c in the third direction is preferably equal to or less than 70%, more preferably equal to or less than 50%, of the thickness t2 of the second portion 28b in the third direction.

(Modification Example)

Figure 7:
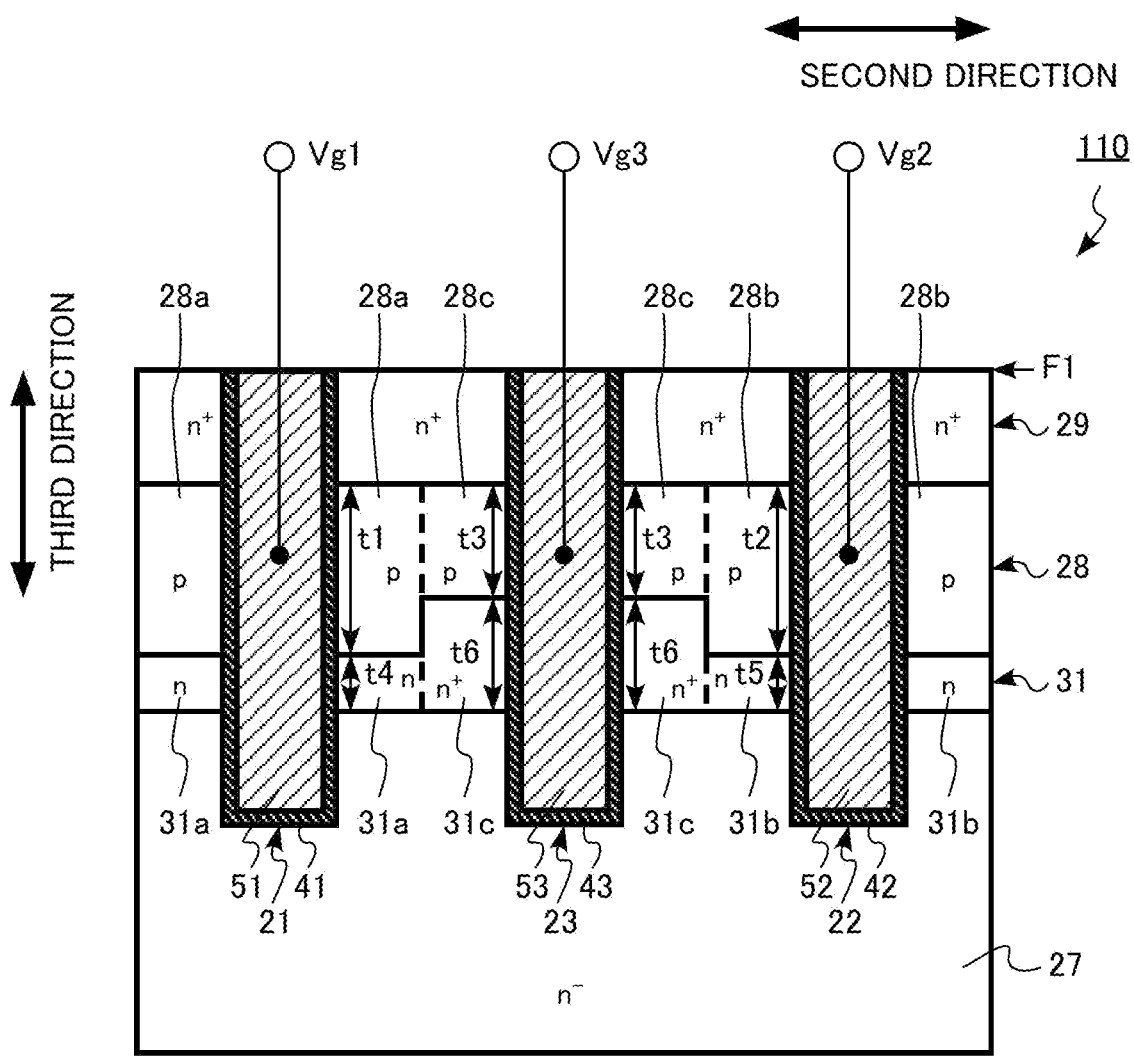
FIG. 7 is an enlarged schematic cross-sectional view of a part of a semiconductor device according to a modification example of the first embodiment.

FIG. 7 is an enlarged schematic cross-sectional view of a part of a semiconductor device according to a modification example of the first embodiment. FIG. 7 is a diagram corresponding to FIG. 5 illustrating the first embodiment.

A semiconductor device according to a modification example of the first embodiment is an IGBT 110. The IGBT 110 according to the modification example is different from the IGBT 100 according to the first embodiment in that the n-type impurity concentration of the sixth portion 31c of the barrier region 31 is higher than the n-type impurity concentration of the fourth portion 31a, and the n-type impurity concentration of the sixth portion 31c is higher than the n-type impurity concentration of the fifth portion 31b.

The n-type impurity concentration of the sixth portion 31c is, for example, equal to or more than 120% and equal to or less than 200% of the n-type impurity concentration of the fourth portion 31a. Also, the n-type impurity concentration of the fifth portion 31b is, for example, equal to or more than 120% and equal to or less than 200% of the n-type impurity concentration of the fourth portion 31a.

Since the n-type impurity concentration of the sixth portion 31c is higher than the n-type impurity concentration of the fourth portion 31a, the threshold voltage of the third transistor having the third gate electrode 53 is still lower than the threshold voltage of the first transistor having the first gate electrode 51 due to the short channel effect. Also, since the n-type impurity concentration of the sixth portion 31c is higher than the n-type impurity concentration of the fifth portion 31b, the threshold voltage of the third transistor having the third gate electrode 53 is still lower than the threshold voltage of the second transistor having the second gate electrode 52 due to the short channel effect.

The third transistor having the third gate electrode 53 starts the turn-on operation still earlier. Therefore, the amount of electrons injected into the drift region 27 increases more quickly. Therefore, the turn-on time of the IGBT 110 can further be shortened. Consequently, the turn-on loss of the IGBT 110 is further reduced.

As described above, according to the first embodiment and the modification example, the semiconductor device and the semiconductor circuit capable of reducing the switching loss can be achieved.

Second Embodiment

A semiconductor device and a semiconductor circuit according to a second embodiment are different from the semiconductor device and the semiconductor circuit according to the first embodiment in that at least one third trench includes a pair of adjacent third trenches, and in that the third portion is located between the paired third trenches. Hereinbelow, description of the content overlapping with that of the first embodiment may partially be omitted.

The semiconductor device according to the second embodiment is an IGBT 200. The IGBT 200 is a trench gate type IGBT including a gate electrode in a trench formed in a semiconductor layer. Hereinbelow, a case where the first conductivity type is p-type and the second conductivity type is n-type will be described as an example.

The control circuit according to the second embodiment is the gate driver circuit 150. The semiconductor circuit according to the second embodiment includes a semiconductor device and a control circuit that controls the semiconductor device. The semiconductor circuit is, for example, a semiconductor module on which the IGBT 200 and the gate driver circuit 150 are implemented.

Figure 8:
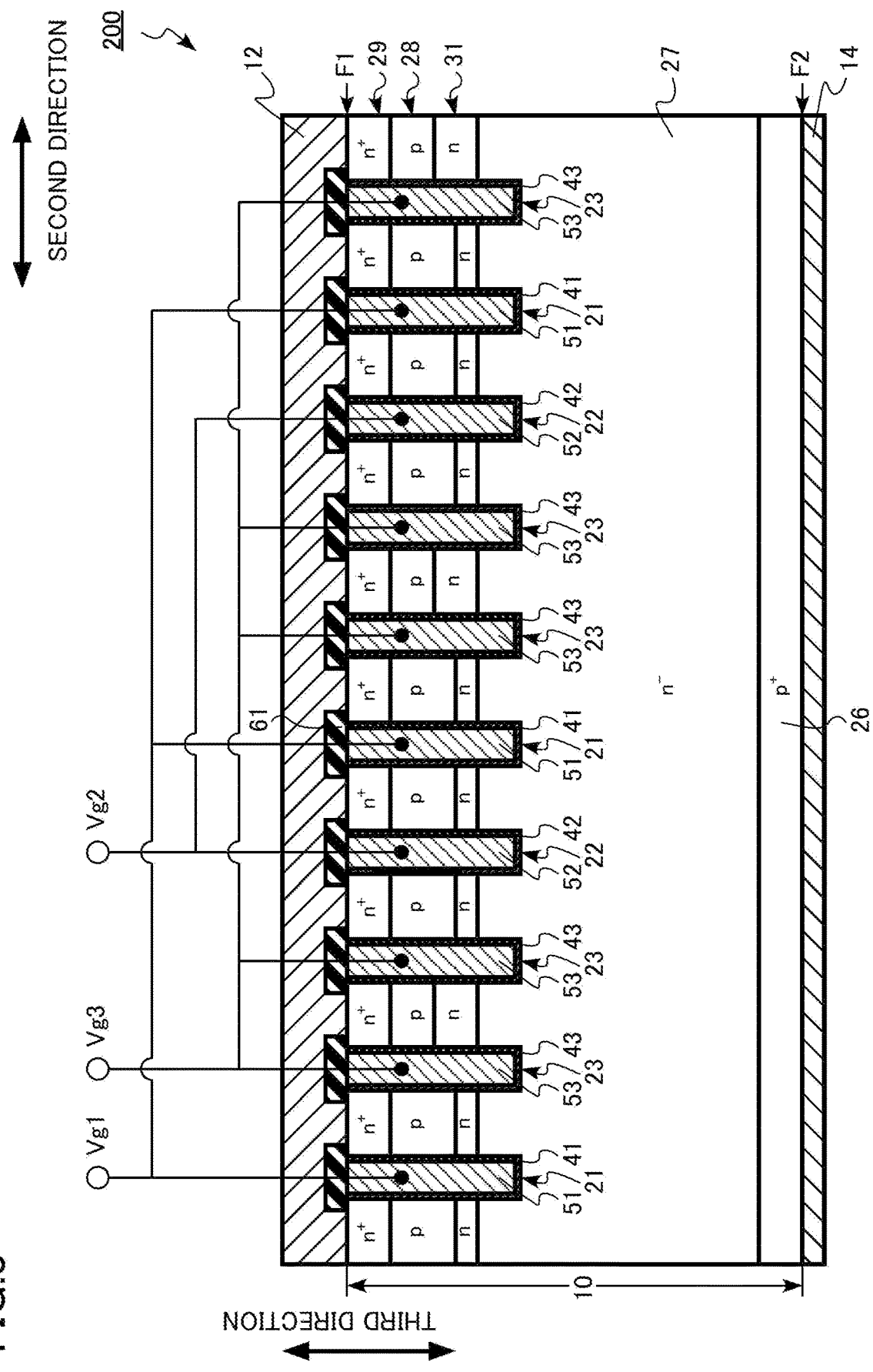
FIG. 8 is a schematic cross-sectional view of a part of a semiconductor device according to a second embodiment.

FIG. 8 is a schematic cross-sectional view of a part of the semiconductor device according to the second embodiment. FIG. 8 is a diagram corresponding to FIG. 2 illustrating the first embodiment.

The IGBT 200 according to the second embodiment includes the semiconductor layer 10, the emitter electrode 12 (first electrode), the collector electrode 14 (second electrode), the first gate insulating film 41, the second gate insulating film 42, the third gate insulating film 43, the first gate electrode 51, the second gate electrode 52, the third gate electrode 53, the interlayer insulating layer 61, the first gate electrode pad 104 (first electrode pad), the second gate electrode pad 105 (second electrode pad), and the third gate electrode pad 106 (third electrode pad).

In the semiconductor layer 10, a first gate trench 21 (first trench), a second gate trench 22 (second trench), a third gate trench 23 (third trench), a collector region 26 (first semiconductor region), a drift region 27 (second semiconductor region), a base region 28 (third semiconductor region), an emitter region 29 (fourth semiconductor region), a contact region 30, and a barrier region 31 (fifth semiconductor region) are provided.

The base region 28 includes a first portion 28a, a second portion 28b, and a third portion 28c. The barrier region 31 includes a fourth portion 31a, a fifth portion 31b, and a sixth portion 31c.

The IGBT 200 according to the second embodiment includes a pair of third gate trenches 23 adjacent in the second direction. The first gate trench 21 and the second gate trench 22 do not exist between the paired adjacent third gate trenches 23.

Figure 9:
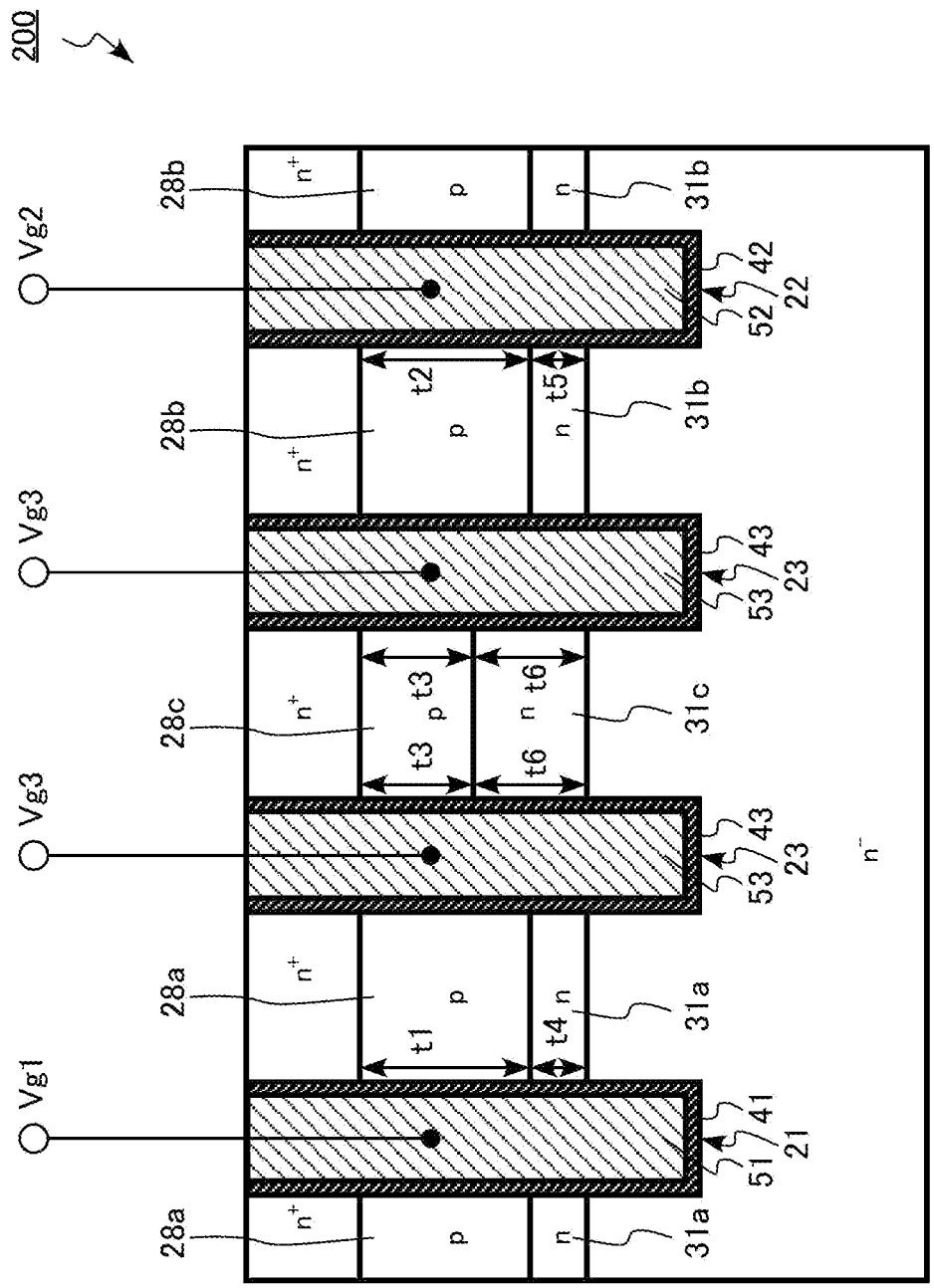
FIG. 9 is an enlarged schematic cross-sectional view of a part of the semiconductor device according to the second embodiment.

FIG. 9 is an enlarged schematic cross-sectional view of a part of the semiconductor device according to the second embodiment. FIG. 9 is an enlarged view of a part of FIG. 8. FIG. 9 is a diagram corresponding to FIG. 5 illustrating the first embodiment.

As illustrated in FIG. 9, the base region 28 includes the first portion 28a, the second portion 28b, and the third portion 28c.

The first portion 28a is a portion of the base region 28 coming in contact with the first gate trench 21. The first portion 28a is in contact with the first gate insulating film 41. The first portion 28a is opposed to the first gate electrode 51.

The first portion 28a functions as a channel region of a first transistor having the first gate electrode 51, the first gate insulating film 41, and the first portion 28a. The first transistor is a transistor driven by the first gate voltage (Vg1) applied to the first gate electrode 51.

The second portion 28b is a portion of the base region 28 coming in contact with the second gate trench 22. The second portion 28b is in contact with the second gate insulating film 42. The second portion 28b is opposed to the second gate electrode 52.

The second portion 28b functions as a channel region of a second transistor having the second gate electrode 52, the second gate insulating film 42, and the second portion 28b. The second transistor is a transistor driven by the second gate voltage (Vg2) applied to the second gate electrode 52.

The third portion 28c is a portion of the base region 28 coming in contact with the third gate trench 23. The third portion 28c is in contact with the third gate insulating film 43. The third portion 28c is opposed to the third gate electrode 53.

The third portion 28c is provided between the paired third gate trenches 23 adjacent in the second direction.

The third portion 28c functions as a channel region of a third transistor having the third gate electrode 53, the third gate insulating film 43, and the third portion 28c. The third transistor is a transistor driven by the third gate voltage (Vg3) applied to the third gate electrode 53.

The thickness (t3 in FIG. 9) of the third portion 28c in the third direction is smaller than the thickness (t1 in FIG. 9) of the first portion 28a in the third direction. The thickness t3 of the third portion 28c in the third direction is, for example, equal to or more than 20% or more and equal to or less than 70% of the thickness t1 of the first portion 28a in the third direction.

Also, the thickness (t3 in FIG. 9) of the third portion 28c in the third direction is smaller than the thickness (t2 in FIG. 9) of the second portion 28b in the third direction. The thickness t3 of the third portion 28c in the third direction is, for example, equal to or more than 20% or more and equal to or less than 70% of the thickness t2 of the second portion 28b in the third direction.

As illustrated in FIG. 9, the barrier region 31 includes the fourth portion 31a, the fifth portion 31b, and the sixth portion 31c.

The fourth portion 31a is a portion of the barrier region 31 coming in contact with the first gate trench 21. The fourth portion 31a is in contact with the first gate insulating film 41. The fourth portion 31a is opposed to the first gate electrode 51. The fourth portion 31a is provided between the drift region 27 and the first portion 28a.

The fifth portion 31b is a portion of the barrier region 31 coming in contact with the second gate trench 22. The fifth portion 31b is in contact with the second gate insulating film 42. The fifth portion 31b is opposed to the second gate electrode 52. The fifth portion 31b is provided between the drift region 27 and the second portion 28b.

The sixth portion 31c is a portion of the barrier region 31 coming in contact with the third gate trench 23. The sixth portion 31c is in contact with the third gate insulating film 43. The sixth portion 31c is opposed to the third gate electrode 53. The sixth portion 31c is provided between the drift region 27 and the third portion 28c.

The thickness (t6 in FIG. 9) of the sixth portion 31c in the third direction is larger than the thickness (t4 in FIG. 9) of the fourth portion 31a in the third direction. The thickness t6 of the sixth portion 31c in the third direction is, for example, equal to or more than 150% of the thickness t4 of the fourth portion 31a in the third direction.

The thickness (t6 in FIG. 9) of the sixth portion 31c in the third direction is larger than the thickness (t5 in FIG. 9) of the fifth portion 31b in the third direction. The thickness t6 of the sixth portion 31c in the third direction is, for example, equal to or more than 150% of the thickness t5 of the fifth portion 31b in the third direction.

The IGBT 200 according to the second embodiment reduces the switching loss due to a similar function to that of the IGBT 100 according to the first embodiment.

Also, in the IGBT 200 according to the second embodiment, the density of the third gate trenches 23 in the first face F1 is higher than the density of the first gate trenches 21 and the density of the second gate trenches 22 unlike in the IGBT 100 according to the first embodiment. Therefore, the amount of electrons injected when the IGBT 200 is turned on is still larger than that of the IGBT 100. Consequently, the turn-on loss is further reduced.

As described above, according to the second embodiment, the semiconductor device and the semiconductor circuit capable of reducing the switching loss can be achieved.

Third Embodiment

A semiconductor device according to a third embodiment includes a semiconductor layer including a first face and a second face opposed to the first face, a first semiconductor region of a first conductivity type provided in the semiconductor layer, a second semiconductor region of a second conductivity type provided in the semiconductor layer and provided between the first semiconductor region and the first face, a third semiconductor region of the first conductivity type provided in the semiconductor layer and provided between the second semiconductor region and the first face, a fourth semiconductor region of the second conductivity type provided in the semiconductor layer and provided between the third semiconductor region and the first face, a first trench provided in the semiconductor layer on a side of the first face and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided in the semiconductor layer on the side of the first face and in contact with the second semiconductor region, the third semiconductor region, and the fourth semiconductor region, a second gate electrode provided in the second trench, a second gate insulating film provided between the second gate electrode and the second semiconductor region, between the second gate electrode and the third semiconductor region, and between the second gate electrode and the fourth semiconductor region, at least one third trench provided in the semiconductor layer on the side of the first face and in contact with the second semiconductor region, the third semiconductor region, and the fourth semiconductor region, a third gate electrode provided in the at least one third trench, a third gate insulating film provided between the third gate electrode and the second semiconductor region, between the third gate electrode and the third semiconductor region, and between the third gate electrode and the fourth semiconductor region, a first electrode provided on the semiconductor layer on the side of the first face and in contact with the fourth semiconductor region, a second electrode provided on the semiconductor layer on a side of the second face and in contact with the first semiconductor region, a first electrode pad provided on the semiconductor layer on the side of the first face and electrically connected to the first gate electrode, a second electrode pad provided on the semiconductor layer on the side of the first face and electrically connected to the second gate electrode, and a third electrode pad provided on the semiconductor layer on the side of the first face and electrically connected to the third gate electrode. The third semiconductor region includes a first portion in contact with the first trench, a second portion in contact with the second trench, and a third portion in contact with the at least one third trench. A first conductivity type impurity concentration of the third portion is lower than a first conductivity type impurity concentration of the first portion. The first conductivity type impurity concentration of the third portion is lower than a first conductivity type impurity concentration of the second portion.

A semiconductor circuit according to the third embodiment includes a control circuit that drives the aforementioned semiconductor device.

The semiconductor device and the semiconductor circuit according to the third embodiment are different from the semiconductor device and the semiconductor circuit according to the first embodiment in that the first conductivity type impurity concentration of the third portion is lower than the first conductivity type impurity concentration of the first portion, and in that the first conductivity type impurity concentration of the third portion is lower than the first conductivity type impurity concentration of the second portion. Hereinbelow, description of the content overlapping with that of the first embodiment may be omitted.

The semiconductor device according to the third embodiment is an IGBT 300. The IGBT 300 is a trench gate type IGBT including a gate electrode in a trench formed in a semiconductor layer. Hereinbelow, a case where the first conductivity type is p-type and the second conductivity type is n-type will be described as an example.

The control circuit according to the third embodiment is the gate driver circuit 150. The semiconductor circuit according to the third embodiment includes a semiconductor device and a control circuit that controls the semiconductor device. The semiconductor circuit is, for example, a semiconductor module on which the IGBT 300 and the gate driver circuit 150 are implemented.

Figure 10:
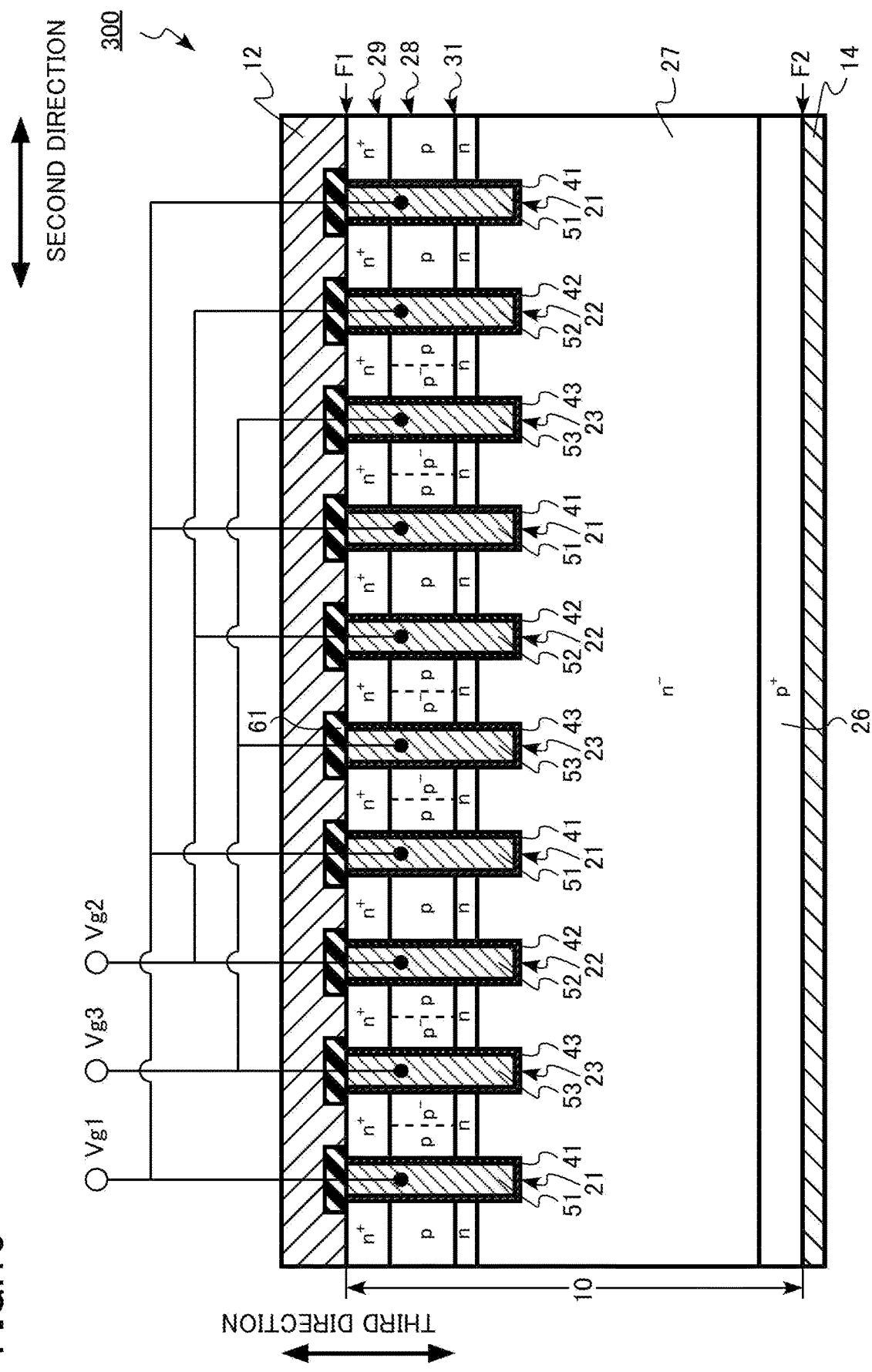
FIG. 10 is a schematic cross-sectional view of a part of a semiconductor device according to a third embodiment.

FIG. 10 is a schematic cross-sectional view of a part of the semiconductor device according to the third embodiment. FIG. 10 is a diagram corresponding to FIG. 2 illustrating the first embodiment.

The IGBT 300 according to the third embodiment includes the semiconductor layer 10, the emitter electrode 12 (first electrode), the collector electrode 14 (second electrode), the first gate insulating film 41, the second gate insulating film 42, the third gate insulating film 43, the first gate electrode 51, the second gate electrode 52, the third gate electrode 53, the interlayer insulating layer 61, the first gate electrode pad 104 (first electrode pad), the second gate electrode pad 105 (second electrode pad), and the third gate electrode pad 106 (third electrode pad).

In the semiconductor layer 10, a first gate trench 21 (first trench), a second gate trench 22 (second trench), a third gate trench 23 (third trench), a collector region 26 (first semiconductor region), a drift region 27 (second semiconductor region), a base region 28 (third semiconductor region), an emitter region 29 (fourth semiconductor region), a contact region 30, and a barrier region 31 (fifth semiconductor region) are provided.

The base region 28 includes a first portion 28a, a second portion 28b, and a third portion 28c.

Figure 11:
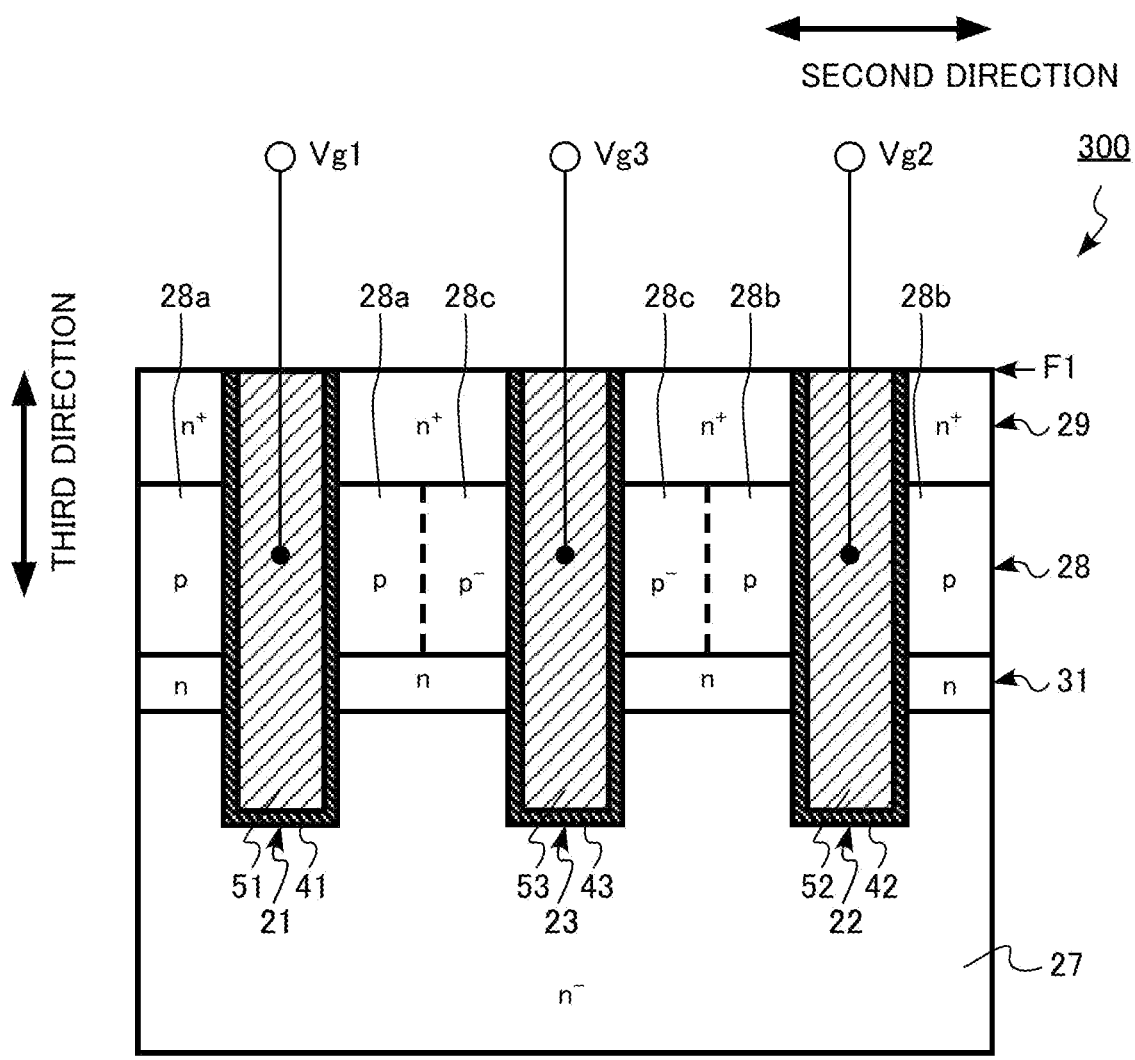
FIG. 11 is an enlarged schematic cross-sectional view of a part of the semiconductor device according to the third embodiment.

FIG. 11 is an enlarged schematic cross-sectional view of a part of the semiconductor device according to the third embodiment. FIG. 11 is an enlarged view of a part of FIG. 10. FIG. 11 is a diagram corresponding to FIG. 5 illustrating the first embodiment.

As illustrated in FIG. 11, the base region 28 includes the first portion 28a, the second portion 28b, and the third portion 28c.

The first portion 28a is a portion of the base region 28 coming in contact with the first gate trench 21. The first portion 28a is in contact with the first gate insulating film 41. The first portion 28a is opposed to the first gate electrode 51.

The first portion 28a functions as a channel region of a first transistor having the first gate electrode 51, the first gate insulating film 41, and the first portion 28a. The first transistor is a transistor driven by the first gate voltage (Vg1) applied to the first gate electrode 51.

The second portion 28b is a portion of the base region 28 coming in contact with the second gate trench 22. The second portion 28b is in contact with the second gate insulating film 42. The second portion 28b is opposed to the second gate electrode 52.

The second portion 28b functions as a channel region of a second transistor having the second gate electrode 52, the second gate insulating film 42, and the second portion 28b. The second transistor is a transistor driven by the second gate voltage (Vg2) applied to the second gate electrode 52.

The third portion 28c is a portion of the base region 28 coming in contact with the third gate trench 23. The third portion 28c is in contact with the third gate insulating film 43. The third portion 28c is opposed to the third gate electrode 53.

The third portion 28c functions as a channel region of a third transistor having the third gate electrode 53, the third gate insulating film 43, and the third portion 28c. The third transistor is a transistor driven by the third gate voltage (Vg3) applied to the third gate electrode 53.

The p-type impurity concentration of the third portion 28c is lower than the p-type impurity concentration of the first portion 28a. The p-type impurity concentration of the third portion 28c is, for example, equal to or more than 50% and equal to or less than 80% of the p-type impurity concentration of the first portion 28a.

Also, the p-type impurity concentration of the third portion 28c is lower than the p-type impurity concentration of the second portion 28b. The p-type impurity concentration of the third portion 28c is, for example, equal to or more than 50% and equal to or less than 80% of the p-type impurity concentration of the second portion 28b.

In the IGBT 300 according to the third embodiment, the p-type impurity concentration of the third portion 28c is lower than the p-type impurity concentration of the first portion 28a. Therefore, the threshold voltage of the third transistor having the third gate electrode 53 is lower than the threshold voltage of the first transistor having the first gate electrode 51.

Also, in the IGBT 300 according to the third embodiment, the p-type impurity concentration of the third portion 28c is lower than the p-type impurity concentration of the second portion 28b. Therefore, the threshold voltage of the third transistor having the third gate electrode 53 is lower than the threshold voltage of the second transistor having the second gate electrode 52.

The threshold voltage of the third transistor having the third gate electrode 53 is lower than the threshold voltage of the first transistor having the first gate electrode 51 and the threshold voltage of the second transistor having the second gate electrode 52. Hence, for example, in a case where the turn-on voltage is applied to the first gate electrode 51, the second gate electrode 52, and the third gate electrode 53 at the same time at time T1 in FIG. 6, the third transistor having the third gate electrode 53 starts the turn-on operation earlier. Therefore, the amount of electrons injected into the drift region 27 increases quickly. Therefore, the turn-on time of the IGBT 300 can be shortened. Consequently, the turn-on loss of the IGBT 300 is reduced.

From the viewpoint of lowering the threshold voltage of the third transistor having the third gate electrode 53, the p-type impurity concentration of the third portion 28c is preferably equal to or less than 80% of the p-type impurity concentration of the second portion 28b. From the viewpoint of lowering the threshold voltage of the third transistor having the third gate electrode 53, the p-type impurity concentration of the third portion 28c is preferably equal to or less than 80% of the p-type impurity concentration of the second portion 28b.

As described above, according to the third embodiment, the semiconductor device and the semiconductor circuit capable of reducing the switching loss can be achieved.

Fourth Embodiment

A semiconductor device according to a fourth embodiment includes a semiconductor layer including a first face and a second face opposed to the first face, a first semiconductor region of a first conductivity type provided in the semiconductor layer, a second semiconductor region of a second conductivity type provided in the semiconductor layer and provided between the first semiconductor region and the first face, a third semiconductor region of the first conductivity type provided in the semiconductor layer and provided between the second semiconductor region and the first face, a fourth semiconductor region of the second conductivity type provided in the semiconductor layer and provided between the third semiconductor region and the first face, a fifth semiconductor region of the second conductivity type provided in the semiconductor layer, provided between the second semiconductor region and the third semiconductor region, and having a higher second conductivity type impurity concentration than a second conductivity type impurity concentration of the second semiconductor region, a first trench provided in the semiconductor layer on a side of the first face and in contact with the second semiconductor region, the third semiconductor region, the fourth semiconductor region, and the fifth semiconductor region, a first gate electrode provided in the first trench, a first gate insulating film provided between the first gate electrode and the second semiconductor region, between the first gate electrode and the third semiconductor region, between the first gate electrode and the fourth semiconductor region, and between the first gate electrode and the fifth semiconductor region, a second trench provided in the semiconductor layer on the side of the first face and in contact with the second semiconductor region, the third semiconductor region, the fourth semiconductor region, and the fifth semiconductor region, a second gate electrode provided in the second trench, a second gate insulating film provided between the second gate electrode and the second semiconductor region, between the second gate electrode and the third semiconductor region, between the second gate electrode and the fourth semiconductor region, and between the second gate electrode and the fifth semiconductor region, at least one third trench provided in the semiconductor layer on the side of the first face and in contact with the second semiconductor region, the third semiconductor region, the fourth semiconductor region, and the fifth semiconductor region, a third gate electrode provided in the at least one third trench, a third gate insulating film provided between the third gate electrode and the second semiconductor region, between the third gate electrode and the third semiconductor region, between the third gate electrode and the fourth semiconductor region, and between the third gate electrode and the fifth semiconductor region, a first electrode provided on the semiconductor layer on the side of the first face and in contact with the fourth semiconductor region, a second electrode provided on the semiconductor layer on a side of the second face and in contact with the first semiconductor region, a first electrode pad provided on the semiconductor layer on the side of the first face and electrically connected to the first gate electrode, a second electrode pad provided on the semiconductor layer on the side of the first face and electrically connected to the second gate electrode, and a third electrode pad provided on the semiconductor layer on the side of the first face and electrically connected to the third gate electrode. The fifth semiconductor region includes a first portion in contact with the first trench, a second portion in contact with the second trench, and a third portion in contact with the at least one third trench. A second conductivity type impurity concentration of the third portion is higher than a second conductivity type impurity concentration of the first portion, and the second conductivity type impurity concentration of the third portion is higher than a second conductivity type impurity concentration of the second portion.

A semiconductor circuit according to the fourth embodiment includes a control circuit that drives the aforementioned semiconductor device.

The semiconductor device and the semiconductor circuit according to the fourth embodiment are different from the semiconductor device and the semiconductor circuit according to the first embodiment in that the fifth semiconductor region includes a first portion in contact with the first trench, a second portion in contact with the second trench, and a third portion in contact with the at least one third trench, and in that a second conductivity type impurity concentration of the third portion is higher than a second conductivity type impurity concentration of the first portion, and the second conductivity type impurity concentration of the third portion is higher than a second conductivity type impurity concentration of the second portion. Hereinbelow, description of the content overlapping with that of the first embodiment may be omitted.

The semiconductor device according to the fourth embodiment is an IGBT 400. The IGBT 400 is a trench gate type IGBT including a gate electrode in a trench formed in a semiconductor layer. Hereinbelow, a case where the first conductivity type is p-type and the second conductivity type is n-type will be described as an example.

The control circuit according to the fourth embodiment is the gate driver circuit 150. The semiconductor circuit according to the fourth embodiment includes a semiconductor device and a control circuit that controls the semiconductor device. The semiconductor circuit is, for example, a semiconductor module on which the IGBT 400 and the gate driver circuit 150 are implemented.

Figure 12:
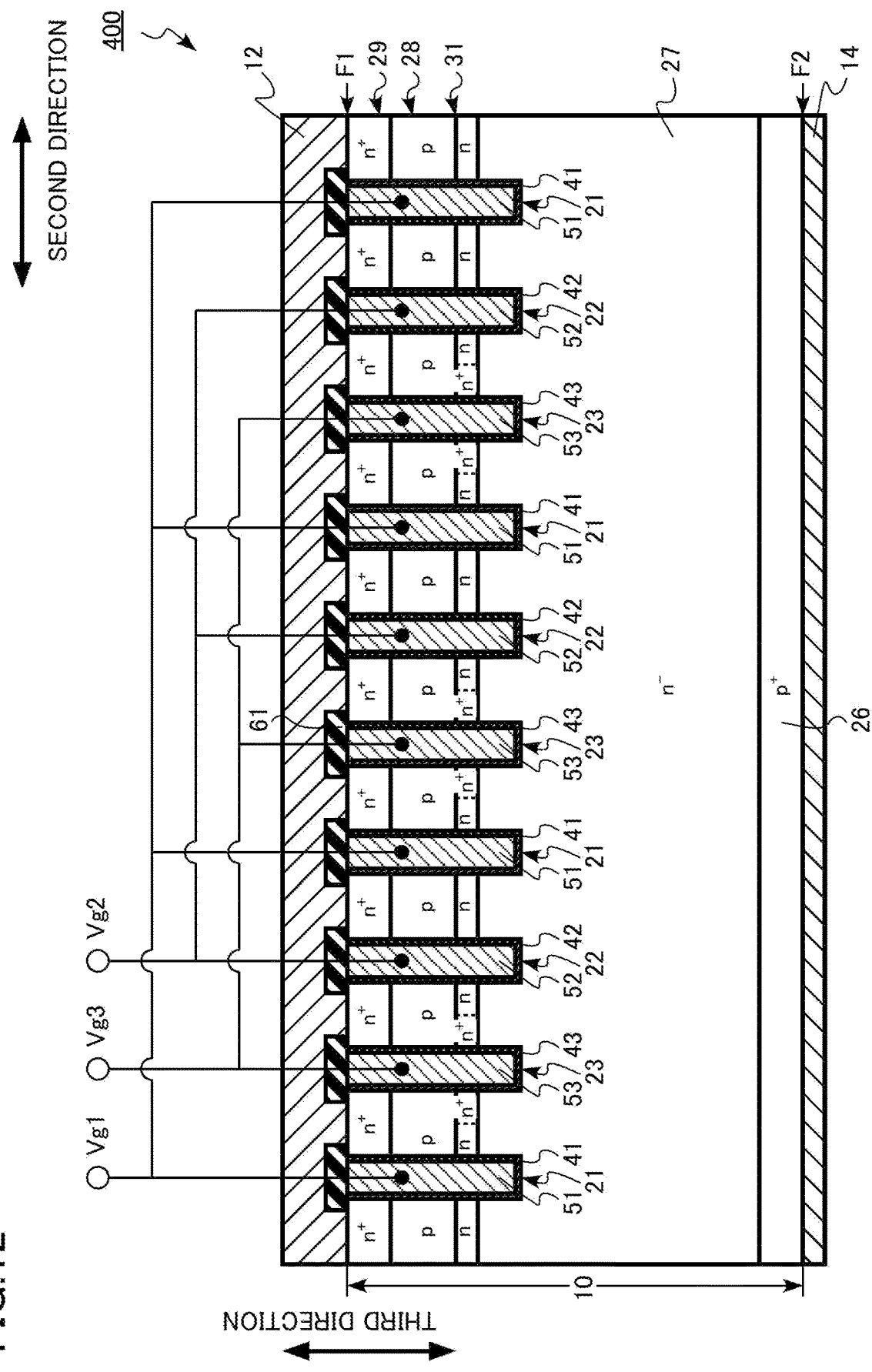
FIG. 12 is a schematic cross-sectional view of a part of a semiconductor device according to a fourth embodiment.

FIG. 12 is a schematic cross-sectional view of a part of the semiconductor device according to the fourth embodiment. FIG. 12 is a diagram corresponding to FIG. 2 illustrating the first embodiment.

The IGBT 400 according to the fourth embodiment includes the semiconductor layer 10, the emitter electrode 12 (first electrode), the collector electrode 14 (second electrode), the first gate insulating film 41, the second gate insulating film 42, the third gate insulating film 43, the first gate electrode 51, the second gate electrode 52, the third gate electrode 53, the interlayer insulating layer 61, the first gate electrode pad 104 (first electrode pad), the second gate electrode pad 105 (second electrode pad), and the third gate electrode pad 106 (third electrode pad).

In the semiconductor layer 10, a first gate trench 21 (first trench), a second gate trench 22 (second trench), a third gate trench 23 (third trench), a collector region 26 (first semiconductor region), a drift region 27 (second semiconductor region), a base region 28 (third semiconductor region), an emitter region 29 (fourth semiconductor region), a contact region 30, and a barrier region 31 (fifth semiconductor region) are provided.

The barrier region 31 includes a first low concentration portion 31$x$ (first portion), a second low concentration portion 31$y$ (second portion), and a high concentration portion 31$z$ (third portion).

Figure 13:
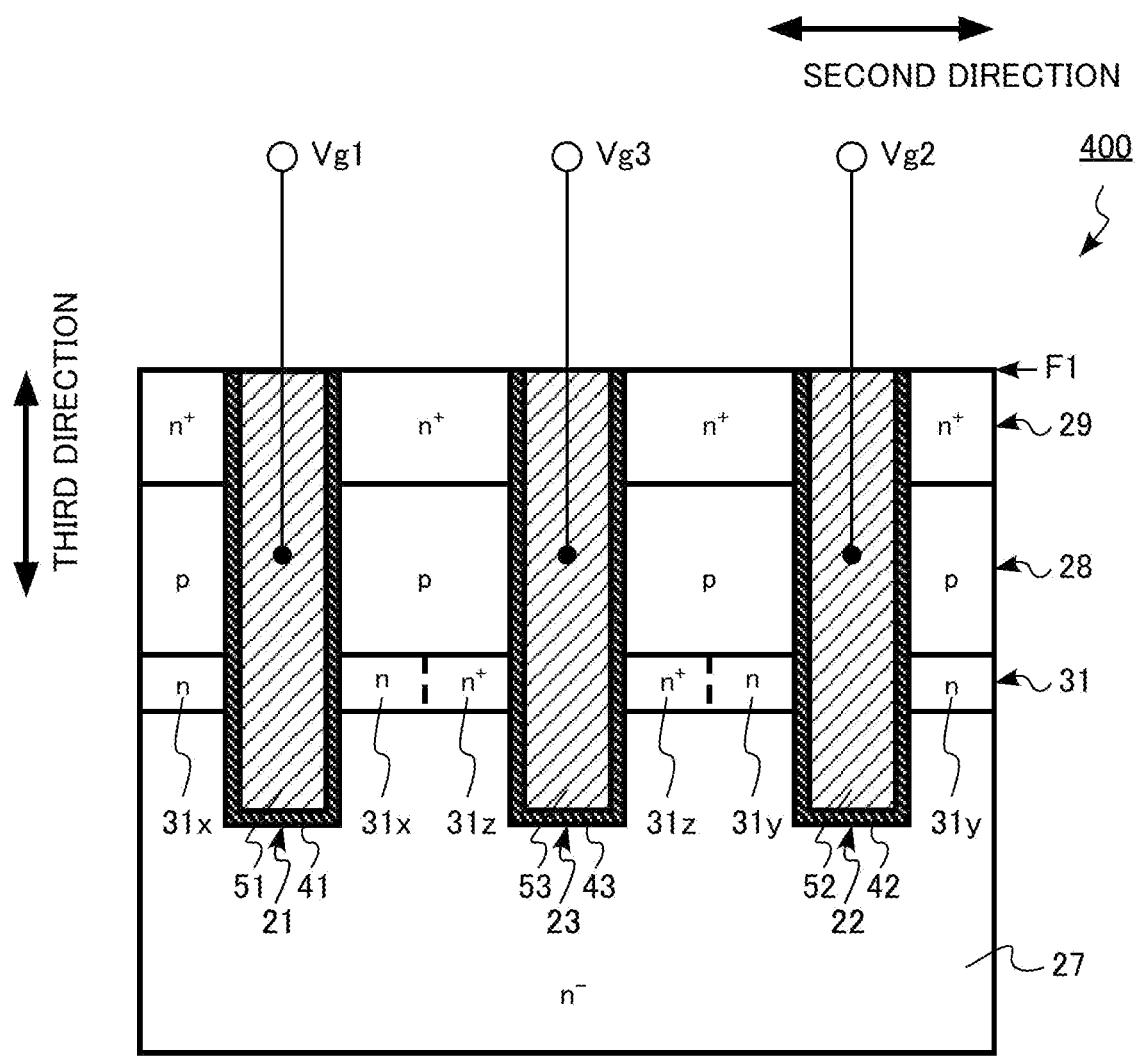
FIG. 13 is an enlarged schematic cross-sectional view of a part of the semiconductor device according to the fourth embodiment.

FIG. 13 is an enlarged schematic cross-sectional view of a part of the semiconductor device according to the fourth embodiment. FIG. 13 is an enlarged view of a part of FIG. 12.

As illustrated in FIG. 13, the barrier region 31 includes the first low concentration portion 31$x$, the second low concentration portion 31$y$, and the high concentration portion 31$z$.

The first low concentration portion 31$x$ is a portion of the barrier region 31 coming in contact with the first gate trench 21. The first low concentration portion 31$x$ is in contact with the first gate insulating film 41. The first low concentration portion 31$x$ is opposed to the first gate electrode 51.

The second low concentration portion 31$y$ is a portion of the barrier region 31 coming in contact with the second gate trench 22. The second low concentration portion 31$y$ is in contact with the second gate insulating film 42. The second low concentration portion 31$y$ is opposed to the second gate electrode 52.

The high concentration portion 31$z$ is a portion of the barrier region 31 coming in contact with the third gate trench 23. The high concentration portion 31$z$ is in contact with the third gate insulating film 43. The high concentration portion 31$z$ is opposed to the third gate electrode 53.

The n-type impurity concentration of the high concentration portion 31$z$ is higher than the n-type impurity concentration of the first low concentration portion 31$x$. The n-type impurity concentration of the high concentration portion 31$z$ is, for example, equal to or more than 120% and equal to or less than 200% of the n-type impurity concentration of the first low concentration portion 31$x$.

The n-type impurity concentration of the high concentration portion 31$z$ is higher than the n-type impurity concentration of the second low concentration portion 31y. The n-type impurity concentration of the high concentration portion 31z is, for example, equal to or more than 120% and equal to or less than 200% of the n-type impurity concentration of the second low concentration portion 31y.

Since the n-type impurity concentration of the high concentration portion 31z is higher than the n-type impurity concentration of the first low concentration portion 31x, the threshold voltage of the third transistor having the third gate electrode 53 is lower than the threshold voltage of the first transistor having the first gate electrode 51 due to the short channel effect. In addition, since the n-type impurity concentration of the high concentration portion 31z is higher than the n-type impurity concentration of the second low concentration portion 31y, the threshold voltage of the third transistor having the third gate electrode 53 is lower than the threshold voltage of the second transistor having the second gate electrode 52 due to the short channel effect.

Therefore, at the time of the turn-on operation of the IGBT 400, the third transistor having the third gate electrode 53 starts the turn-on operation earlier. Therefore, the amount of electrons injected into the drift region 27 increases quickly. Therefore, the turn-on time of the IGBT 400 can be shortened. Consequently, the turn-on loss of the IGBT 400 is reduced.

As described above, according to the fourth embodiment, the semiconductor device and the semiconductor circuit capable of reducing the switching loss can be achieved.

Fifth Embodiment

A semiconductor device according to a fifth embodiment includes a semiconductor layer including a first face and a second face opposed to the first face, a first semiconductor region of a first conductivity type provided in the semiconductor layer, a second semiconductor region of a second conductivity type provided in the semiconductor layer and provided between the first semiconductor region and the first face, a third semiconductor region of the first conductivity type provided in the semiconductor layer and provided between the second semiconductor region and the first face, a fourth semiconductor region of the second conductivity type provided in the semiconductor layer and provided between the third semiconductor region and the first face, a first trench provided in the semiconductor layer on a side of the first face and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided in the semiconductor layer on the side of the first face and in contact with the second semiconductor region, the third semiconductor region, and the fourth semiconductor region, a second gate electrode provided in the second trench, a second gate insulating film provided between the second gate electrode and the second semiconductor region, between the second gate electrode and the third semiconductor region, and between the second gate electrode and the fourth semiconductor region, at least one third trench provided in the semiconductor layer on the side of the first face and in contact with the second semiconductor region, the third semiconductor region, and the fourth semiconductor region, a third gate electrode provided in the at least one third trench, a third gate insulating film provided between the third gate electrode and the second semiconductor region, between the third gate electrode and the third semiconductor region, and between the third gate electrode and the fourth semiconductor region, a first electrode provided on the semiconductor layer on the side of the first face and in contact with the fourth semiconductor region, a second electrode provided on the semiconductor layer on a side of the second face and in contact with the first semiconductor region, a first electrode pad provided on the semiconductor layer on the side of the first face and electrically connected to the first gate electrode, a second electrode pad provided on the semiconductor layer on the side of the first face and electrically connected to the second gate electrode, and a third electrode pad provided on the semiconductor layer on the side of the first face and electrically connected to the third gate electrode. A first transistor having the first gate electrode, a second transistor having the second gate electrode, and a third transistor having the third gate electrode are included. A threshold voltage of the third transistor is lower than a threshold voltage of the first transistor, and the threshold voltage of the third transistor is lower than a threshold voltage of the second transistor.

A semiconductor circuit according to the fifth embodiment includes a control circuit that drives the aforementioned semiconductor device.

The semiconductor device according to the fifth embodiment is an IGBT 500. The IGBT 500 is a trench gate type IGBT including a gate electrode in a trench formed in a semiconductor layer. Hereinbelow, a case where the first conductivity type is p-type and the second conductivity type is n-type will be described as an example.

The control circuit according to the fifth embodiment is similar to the gate driver circuit 150 according to the first embodiment. The semiconductor circuit according to the fifth embodiment includes a semiconductor device and a control circuit that controls the semiconductor device. The semiconductor circuit is, for example, a semiconductor module on which the IGBT 500 and the gate driver circuit 150 are implemented.

Figure 14:
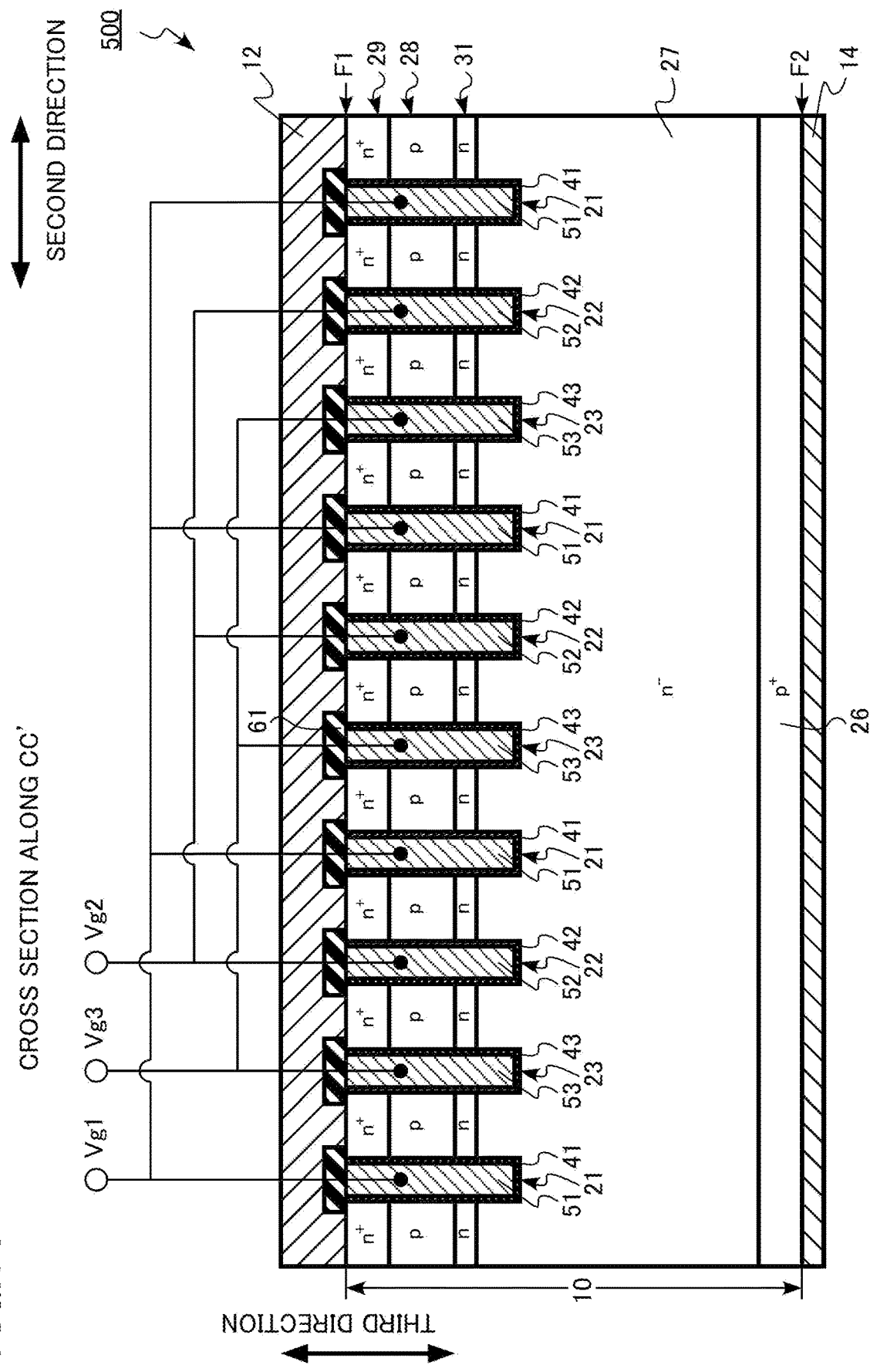
FIG. 14 is a schematic cross-sectional view of a part of a semiconductor device according to a fifth embodiment.

FIG. 14 is a schematic cross-sectional view of a part of the semiconductor device according to the fifth embodiment.

Figure 15:
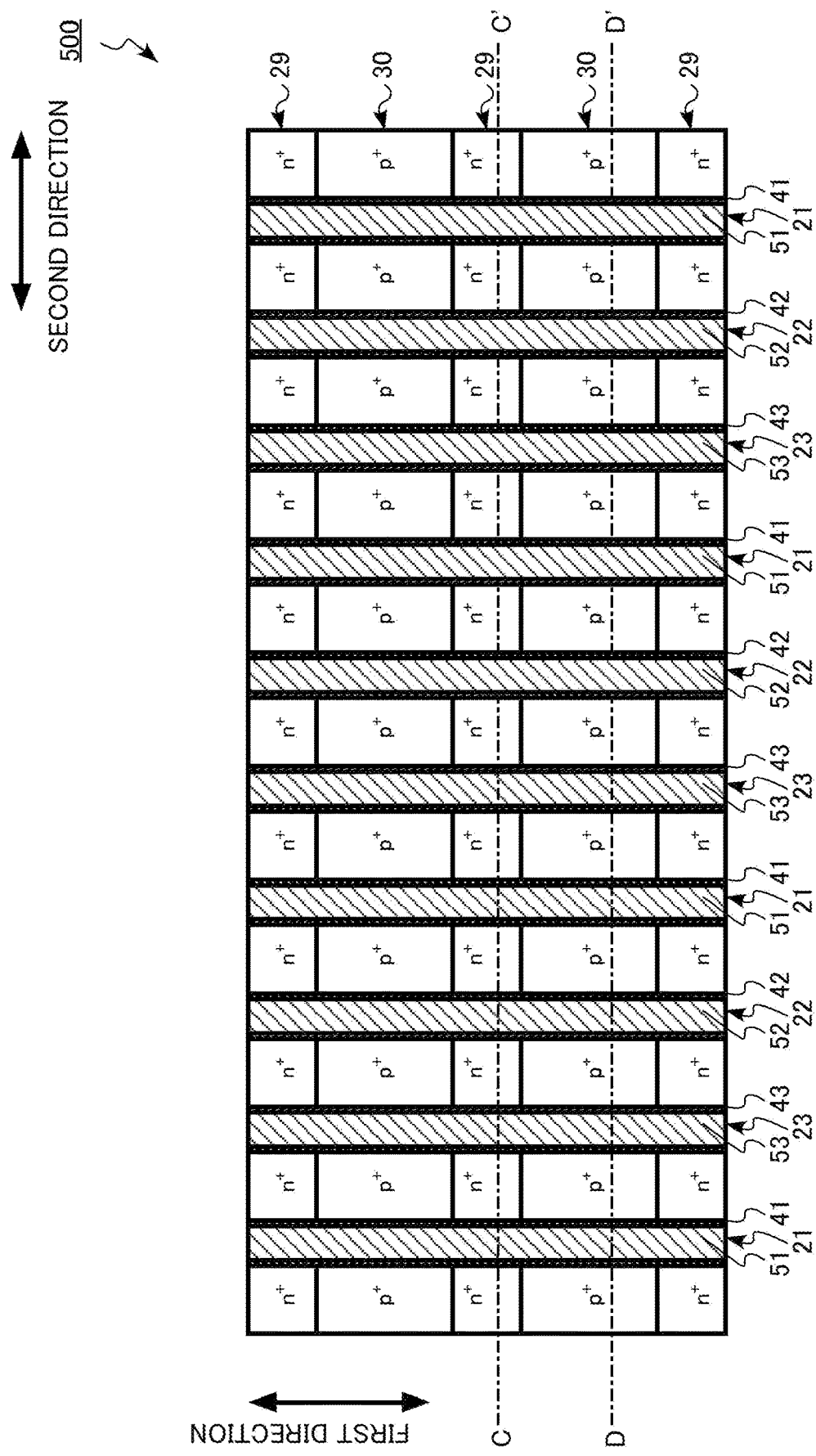
FIG. 15 is a schematic top view of a part of the semiconductor device according to the fifth embodiment.

FIG. 15 is a schematic top view of a part of the semiconductor device according to the fifth embodiment. FIG. 15 is a top view of the first face F1. FIG. 14 is a cross section taken along line CC' in FIG. 15.

FIG. 16 is a schematic cross-sectional view of a part of the semiconductor device according to the fifth embodiment. FIG. 16 is a cross section taken along line DD' in FIG. 15.

The IGBT 500 according to the fifth embodiment includes the semiconductor layer 10, the emitter electrode 12 (first electrode), the collector electrode 14 (second electrode), the first gate insulating film 41, the second gate insulating film 42, the third gate insulating film 43, the first gate electrode 51, the second gate electrode 52, the third gate electrode 53, the interlayer insulating layer 61, the first gate electrode pad 104 (first electrode pad), the second gate electrode pad 105 (second electrode pad), and the third gate electrode pad 106 (third electrode pad).

In the semiconductor layer 10, a first gate trench 21 (first trench), a second gate trench 22 (second trench), a third gate trench 23 (third trench), a collector region 26 (first semiconductor region), a drift region 27 (second semiconductor region), a base region 28 (third semiconductor region), an emitter region 29 (fourth semiconductor region), a contact region 30, and a barrier region 31 (fifth semiconductor region) are provided.

The semiconductor layer 10 includes the first face F1 and a second face F2 opposed to the first face F1. The semiconductor layer 10 is, for example, single crystal silicon. The film thickness of the semiconductor layer 10 is, for example, equal to or more than 40 μm and equal to or less than 700 μm.

One direction parallel to the first face F1 is referred to as a first direction. Also, a direction parallel to the first face F1 and orthogonal to the first direction is referred to as a second direction. Also, a direction from the first face F1 toward the second face F2 is referred to as a third direction.

Also, the "depth" is defined as a distance in a direction toward the second face F2 with reference to the first face F1.

The emitter electrode 12 is provided on a side of the semiconductor layer 10 provided with the first face F1. At least a part of the emitter electrode 12 is in contact with the first face F1 of the semiconductor layer 10. The emitter electrode 12 is, for example, a metal.

The emitter electrode 12 is in contact with the emitter region 29. The emitter electrode 12 is electrically connected to the emitter region 29.

The emitter electrode 12 is in contact with the contact region 30. The emitter electrode 12 is electrically connected to the contact region 30. The emitter electrode 12 is electrically connected to the base region 28 via the contact region 30.

The collector electrode 14 is provided on a side of the semiconductor layer 10 provided with the second face F2. At least a part of the collector electrode 14 is in contact with the second face F2 of the semiconductor layer 10. The collector electrode 14 is, for example, a metal.

The collector electrode 14 is in contact with the collector region 26. The collector electrode 14 is electrically connected to the collector region 26.

The collector region 26 is a $p^+$-type semiconductor region. The collector region 26 is in contact with the second face F2. The collector region 26 is electrically connected to the collector electrode 14. The collector region 26 is in contact with the collector electrode 14. The collector region 26 serves as a source for supplying holes when the IGBT 500 is in the on state.

The drift region 27 is an $n^-$-type semiconductor region. The drift region 27 is provided between the collector region 26 and the first face F1.

The drift region 27 serves as a path of an on-current when the IGBT 500 is in the on state. The drift region 27 has a function of being depleted and maintaining the breakdown voltage of the IGBT 500 when the IGBT 500 is in the off state.

The base region 28 is a p-type semiconductor region. The base region 28 is provided between the drift region 27 and the first face F1. The drift region 27 is sandwiched between the base region 28 and the collector region 26.

The depth of the base region 28 is, for example, equal to or less than 5 μm. N-type inversion layers are formed in a region of the base region 28 opposed to the first gate electrode 51, a region of the base region 28 opposed to the second gate electrode 52, and a region of the base region 28 opposed to the third gate electrode 53 when the IGBT 500 is in the on state. The base region 28 functions as a channel region of a transistor.

The barrier region 31 is an n-type semiconductor region. The barrier region 31 is provided between the drift region 27 and the base region 28. The n-type impurity concentration of the barrier region 31 is higher than the n-type impurity concentration of the drift region 27.

The barrier region 31 has a function of increasing the carrier storage amount in the drift region 27 when the IGBT 500 is in the on state. By providing the barrier region 31, the on-resistance of the IGBT 500 is lowered, and the steady loss of the IGBT 500 is reduced.

The emitter region 29 is an $n^+$-type semiconductor region. The emitter region 29 is provided between the base region 28 and the first face F1.

The emitter region 29 is in contact with the first gate insulating film 41, the second gate insulating film 42, and the third gate insulating film 43.

The n-type impurity concentration of the emitter region 29 is higher than the n-type impurity concentration of the drift region 27.

The emitter region 29 is in contact with the emitter electrode 12. The emitter region 29 is electrically connected to the emitter electrode 12. The emitter region 29 serves as a source for supplying electrons when the IGBT 500 is in the on state.

The contact region 30 is a $p^+$-type semiconductor region. The contact region 30 is provided between the base region 28 and the first face F1. The contact region 30 is in contact with the emitter electrode 12. The contact region 30 is electrically connected to the emitter electrode 12.

The p-type impurity concentration of the contact region 30 is higher than the p-type impurity concentration of the base region 28.

The first gate trench 21 is provided on a side of the semiconductor layer 10 provided with the first face F1. The first gate trench 21 is a trench provided in the semiconductor layer 10. The first gate trench 21 is a part of the semiconductor layer 10.

As illustrated in FIG. 15, the first gate trench 21 extends on the first face F1 in the first direction parallel to the first face F1. The first gate trench 21 is in a stripe shape. The plurality of first gate trenches 21 are repeatedly disposed in the second direction orthogonal to the first direction.

The first gate trench 21 is in contact with the drift region 27, the base region 28, the emitter region 29, and the barrier region 31. The first gate trench 21 penetrates the base region 28 and reaches the drift region 27. The depth of the first gate trench 21 is, for example, equal to or less than 8 μm.

The first gate electrode 51 is provided in the first gate trench 21. The first gate electrode 51 is, for example, a semiconductor or a metal. The first gate electrode 51 is, for example, amorphous silicon or polycrystalline silicon containing n-type impurities or p-type impurities. The first gate electrode 51 is electrically connected to the first gate electrode pad 104.

The first gate insulating film 41 is provided between the first gate electrode 51 and the semiconductor layer 10. The first gate insulating film 41 is provided between the first gate electrode 51 and the drift region 27, between the first gate electrode 51 and the base region 28, between the first gate electrode 51 and the emitter region 29, and between the first gate electrode 51 and the barrier region 31. The first gate insulating film 41 is in contact with the drift region 27, the base region 28, the emitter region 29, and the barrier region 31. The first gate insulating film 41 is, for example, silicon oxide.

The second gate trench 22 is provided on a side of the semiconductor layer 10 provided with the first face F1. The second gate trench 22 is a trench provided in the semiconductor layer 10. The second gate trench 22 is a part of the semiconductor layer 10.

As illustrated in FIG. 15, the second gate trench 22 extends on the first face F1 in the first direction parallel to the first face F1. The second gate trench 22 is in a stripe shape. The plurality of second gate trenches 22 are repeatedly disposed in the second direction orthogonal to the first direction.

The second gate trench 22 is in contact with the drift region 27, the base region 28, the emitter region 29, and the barrier region 31. The second gate trench 22 penetrates the base region 28 and reaches the drift region 27. The depth of the second gate trench 22 is, for example, equal to or less than 8 μm.

The second gate electrode 52 is provided in the second gate trench 22. The second gate electrode 52 is, for example, a semiconductor or a metal. The second gate electrode 52 is, for example, amorphous silicon or polycrystalline silicon containing n-type impurities or p-type impurities. The second gate electrode 52 is electrically connected to the second gate electrode pad 105.

The second gate insulating film 42 is provided between the second gate electrode 52 and the semiconductor layer 10. The second gate insulating film 42 is provided between the second gate electrode 52 and the drift region 27, between the second gate electrode 52 and the base region 28, between the second gate electrode 52 and the emitter region 29, and between the second gate electrode 52 and the barrier region 31. The second gate insulating film 42 is in contact with the drift region 27, the base region 28, the emitter region 29, and the barrier region 31. The second gate insulating film 42 is, for example, silicon oxide.

The third gate trench 23 is provided on a side of the semiconductor layer 10 provided with the first face F1. The third gate trench 23 is a trench provided in the semiconductor layer 10. The third gate trench 23 is a part of the semiconductor layer 10.

As illustrated in FIG. 15, the third gate trench 23 extends on the first face F1 in the first direction parallel to the first face F1. The third gate trench 23 is in a stripe shape. The plurality of third gate trenches 23 are repeatedly disposed in the second direction orthogonal to the first direction.

The third gate trench 23 is in contact with the drift region 27, the base region 28, the emitter region 29, and the barrier region 31. The third gate trench 23 penetrates the base region 28 and reaches the drift region 27. The depth of the third gate trench 23 is, for example, equal to or less than 8 μm.

The third gate electrode 53 is provided in the third gate trench 23. The third gate electrode 53 is, for example, a semiconductor or a metal. The third gate electrode 53 is, for example, amorphous silicon or polycrystalline silicon containing n-type impurities or p-type impurities. The third gate electrode 53 is electrically connected to the third gate electrode pad 106.

The third gate insulating film 43 is provided between the third gate electrode 53 and the semiconductor layer 10. The third gate insulating film 43 is provided between the third gate electrode 53 and the drift region 27, between the third gate electrode 53 and the base region 28, between the third gate electrode 53 and the emitter region 29, and between the third gate electrode 53 and the barrier region 31. The third gate insulating film 43 is in contact with the drift region 27, the base region 28, the emitter region 29, and the barrier region 31. The third gate insulating film 43 is, for example, silicon oxide.

The interlayer insulating layer 61 is provided between the first gate electrode 51 and the emitter electrode 12. The interlayer insulating layer 61 electrically isolates the first gate electrode 51 and the emitter electrode 12 from each other. The interlayer insulating layer 61 is provided between the second gate electrode 52 and the emitter electrode 12.

The interlayer insulating layer 61 electrically isolates the second gate electrode 52 and the emitter electrode 12 from each other. The interlayer insulating layer 61 is provided between the third gate electrode 53 and the emitter electrode 12. The interlayer insulating layer 61 electrically isolates the third gate electrode 53 and the emitter electrode 12 from each other. The interlayer insulating layer 61 is, for example, silicon oxide.

The first gate electrode pad 104 is provided on a side of the semiconductor layer 10 provided with the first face F1. The first gate electrode pad 104 is electrically connected to the first gate electrode 51. The first gate electrode pad 104 and the first gate electrode 51 are connected by, for example, not-illustrated metal wiring.

A first gate voltage (Vg1) is applied to the first gate electrode pad 104.

For example, a first turn-on voltage (Von1) and a first turn-off voltage (Voff1) are applied to the first gate electrode pad 104.

The second gate electrode pad 105 is provided on a side of the semiconductor layer 10 provided with the first face F1. The second gate electrode pad 105 is electrically connected to the second gate electrode 52. The second gate electrode pad 105 and the second gate electrode 52 are connected by, for example, not-illustrated metal wiring.

A second gate voltage (Vg2) is applied to the second gate electrode pad 105. For example, a second turn-on voltage (Von2) and a second turn-off voltage (Voff2) are applied to the second gate electrode pad 105.

The third gate electrode pad 106 is provided on a side of the semiconductor layer 10 provided with the first face F1. The third gate electrode pad 106 is electrically connected to the third gate electrode 53. The third gate electrode pad 106 and the third gate electrode 53 are connected by, for example, not-illustrated metal wiring.

A third gate voltage (Vg3) is applied to the third gate electrode pad 106. For example, a third turn-on voltage (Von3) and a third turn-off voltage (Voff3) are applied to the third gate electrode pad 106.

The IGBT 500 according to the fifth embodiment includes the first transistor having the first gate electrode 51, the second transistor having the second gate electrode 52, and the third transistor having the third gate electrode 53.

The first transistor having the first gate electrode 51 is a transistor driven using the first gate electrode 51. The first transistor includes the first gate electrode 51, the first gate insulating film 41, and the base region 28, the emitter region 29, and the barrier region 31 opposed to the first gate electrode 51, as components. The base region 28 opposed to the first gate electrode 51 is a channel region of the first transistor.

Also, a portion of the emitter region 29 and the barrier region 31 coming in contact with the first gate insulating film 41 is a source/drain region of the first transistor.

The second transistor having the second gate electrode 52 is a transistor driven using the second gate electrode 52. The second transistor includes the second gate electrode 52, the second gate insulating film 42, and the base region 28, the emitter region 29, and the barrier region 31 opposed to the second gate electrode 52, as components. The base region 28 opposed to the second gate electrode 52 is a channel region of the second transistor. Also, a portion of the emitter region 29 and the barrier region 31 coming in contact with the second gate insulating film 42 is a source/drain region of the second transistor.

The third transistor having the third gate electrode 53 is a transistor driven using the third gate electrode 53. The third transistor includes the third gate electrode 53, the third gate insulating film 43, and the base region 28, the emitter region 29, and the barrier region 31 opposed to the third gate electrode 53, as components. The base region 28 opposed to the third gate electrode 53 is a channel region of the third transistor.

Also, a portion of the emitter region 29 and the barrier region 31 coming in contact with the third gate insulating film 43 is a source/drain region of the third transistor.

In the IGBT 500 according to the fifth embodiment, the threshold voltage of the third transistor is lower than the threshold voltage of the first transistor, and the threshold voltage of the third transistor is lower than the threshold voltage of the second transistor.

For example, the film thickness of the third gate insulating film 43 of the third transistor is smaller than the film thickness of the first gate insulating film 41 of the first transistor. In addition, the film thickness of the third gate insulating film 43 of the third transistor is smaller than the film thickness of the second gate insulating film 42 of the second transistor. Since the film thickness of the third gate insulating film 43 of the third transistor is small, the threshold voltage of the third transistor is low.

Also, for example, the dielectric constant of the third gate insulating film 43 of the third transistor is higher than the dielectric constant of the first gate insulating film 41 of the first transistor. In addition, the dielectric constant of the third gate insulating film 43 of the third transistor is higher than the dielectric constant of the second gate insulating film 42 of the second transistor. Since the dielectric constant of the third gate insulating film 43 of the transistor 3 is high, the threshold voltage of the third transistor is low.

Further, for example, the work function of the third gate electrode 53 of the third transistor is different from the work function of the first gate electrode 51 of the first transistor. In addition, the work function of the third gate electrode 53 of the third transistor is different from the work function of the second gate electrode 52 of the second transistor. Since the work function of the third gate electrode 53 of the third transistor is different, the threshold voltage of the third transistor is low.

Further, for example, the p-type impurity concentration of the base region 28 opposed to the third gate electrode 53 of the third transistor is lower than the p-type impurity concentration of the base region 28 opposed to the first gate electrode 51 of the first transistor. In addition, the p-type impurity concentration of the base region 28 opposed to the third gate electrode 53 of the third transistor is lower than the p-type impurity concentration of the base region 28 opposed to the second gate electrode 52 of the second transistor. Since the p-type impurity concentration of the base region 28 opposed to the third gate electrode 53 of the third transistor is low, the threshold voltage of the third transistor is low.

Next, functions and effects of the semiconductor device and the semiconductor circuit according to the fifth embodiment will be described.

The IGBT 500 according to the fifth embodiment operates in a similar driving method to that of the IGBT 100 according to the first embodiment.

Similarly to the IGBT 100 according to the first embodiment, the IGBT 500 according to the fifth embodiment includes, in the transistor region 101, the first transistor having the first gate electrode 51, the second transistor having the second gate electrode 52, and the third transistor having the third gate electrode 53. The respective transistors can be driven independently. With this configuration, the turn-on loss and the turn-off loss of the IGBT 500 can be reduced.

In the IGBT 500 according to the fifth embodiment, the threshold voltage of the third transistor is lower than the threshold voltage of the first transistor, and the threshold voltage of the third transistor is lower than the threshold voltage of the second transistor.

The threshold voltage of the third transistor of the IGBT 500 according to the fifth embodiment is lower than the threshold voltage of the first transistor and the threshold voltage of the second transistor. Hence, for example, in a case where the turn-on voltage is applied to the first gate electrode 51, the second gate electrode 52, and the third gate electrode 53 at the same time at time T1 in FIG. 6, the third transistor having the third gate electrode 53 starts the turn-on operation earlier.

Therefore, the amount of electrons injected into the drift region 27 increases quickly. Therefore, the turn-on time of the IGBT 500 can further be shortened. Consequently, the turn-on loss of the IGBT 500 is further reduced.

As described above, according to the fifth embodiment, the semiconductor device and the semiconductor circuit capable of reducing the switching loss can be achieved.

In the first to fifth embodiments, the case where the semiconductor layer is single crystal silicon has been described as an example, but the semiconductor layer is not limited to single crystal silicon. For example, other single crystal semiconductors such as single crystal silicon carbide may be used.

In the first to fifth embodiments, the case where the semiconductor device includes the first gate trench, the second gate trench, and the third gate trench has been described as an example. However, for example, a dummy trench in which the electric potential of the conductive layer in the trench is a constant electric potential or a floating electric potential may further be provided.

In the first to fifth embodiments, the case where the trenches are disposed in parallel in a stripe shape has been described as an example, but the present disclosure can also be applied to a case where the trenches intersect in a mesh shape or a case where the trenches are in a dot shape.

In the first to fifth embodiments, the case where the first conductivity type is p-type and the second conductivity type is n-type has been described as an example, but the first conductivity type may be n-type and the second conductivity type may be p-type.

While certain embodiments have been described, these embodiments have been presented by way of example only, and are not intended to limit the scope of the inventions. Indeed, a semiconductor device and a semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
 a semiconductor layer including a first face and a second face opposed to the first face;
 a first semiconductor region of a first conductivity type provided in the semiconductor layer;

a second semiconductor region of a second conductivity type provided in the semiconductor layer and provided between the first semiconductor region and the first face;

a third semiconductor region of the first conductivity type provided in the semiconductor layer and provided between the second semiconductor region and the first face;

a fourth semiconductor region of the second conductivity type provided in the semiconductor layer and provided between the third semiconductor region and the first face;

a fifth semiconductor region of the second conductivity type provided in the semiconductor layer, provided between the second semiconductor region and the third semiconductor region, and having a higher second conductivity type impurity concentration than a second conductivity type impurity concentration of the second semiconductor region;

a sixth semiconductor region of the first conductivity type provided in the semiconductor layer, provided between the third semiconductor region and the first face, and having a higher first conductivity type impurity concentration than a first conductivity type impurity concentration of the third semiconductor region;

a first trench provided in the semiconductor layer on a side of the first face, the first trench extending in a first direction parallel to the first face, and being in contact with the second semiconductor region, the third semiconductor region, the fourth semiconductor region, the fifth semiconductor region, and the sixth semiconductor region;

a first gate insulating film provided between the first gate electrode and the second semiconductor region, between the first gate electrode and the third semiconductor region, between the first gate electrode and the fourth semiconductor region, between the first gate electrode and the fifth semiconductor region, and between the first gate electrode and the sixth semiconductor region;

a second trench provided in the semiconductor layer on the side of the first face, the second trench extending in the first direction, and being in contact with the second semiconductor region, the third semiconductor region, the fourth semiconductor region, the fifth semiconductor region, and the sixth semiconductor region;

a second gate electrode provided in the second trench;

a second gate insulating film provided between the second gate electrode and the second semiconductor region, between the second gate electrode and the third semiconductor region, between the second gate electrode and the fourth semiconductor region, between the second gate electrode and the fifth semiconductor region, and between the second gate electrode and the sixth semiconductor region;

at least one third trench provided in the semiconductor layer on the side of the first face, the at least one third trench extending in the first direction, and being in contact with the second semiconductor region, the third semiconductor region, the fourth semiconductor region, the fifth semiconductor region, and the sixth semiconductor region;

a third gate electrode provided in the at least one third trench;

a third gate insulating film provided between the third gate electrode and the second semiconductor region, between the third gate electrode and the third semiconductor region, between the third gate electrode and the fourth semiconductor region, between the third gate electrode and the fifth semiconductor region, and between the third gate electrode and the sixth semiconductor region;

a first electrode provided on the semiconductor layer on the side of the first face and in contact with the fourth semiconductor region;

a second electrode provided on the semiconductor layer on a side of the second face and in contact with the first semiconductor region;

a first electrode pad provided on the semiconductor layer on the side of the first face and electrically connected to the first gate electrode;

a second electrode pad provided on the semiconductor layer on the side of the first face and electrically connected to the second gate electrode; and a third electrode pad provided on the semiconductor layer on the side of the first face and electrically connected to the third gate electrode, wherein the sixth semiconductor region provided in the first direction of the fourth semiconductor region, and the sixth semiconductor region is in contact with the fourth semiconductor region in the first direction, wherein in a first cross section perpendicular to the first direction and including the fourth semiconductor region, the fourth semiconductor region is in contact with the first trench, the second trench, and the at least one third trench, wherein in a second cross section perpendicular to the first direction and including the sixth semiconductor region, the sixth semiconductor region is in contact with the first trench, the second trench, and the at least one third trench, wherein the third semiconductor region includes a first portion in contact with the first trench, a second portion in contact with the second trench, and a third portion in contact with the at least one third trench, wherein the first portion is in contact with the fourth semiconductor region and the fifth semiconductor region in a third direction from the first face toward the second face in the first cross section, and the first portion is in contact with the sixth semiconductor region and the fifth semiconductor region in the third direction in the second cross section, wherein the second portion is in contact with the fourth semiconductor region and the fifth semiconductor region in the third direction in the first cross section, and the second portion is in contact with the sixth semiconductor region and the fifth semiconductor region in the third direction in the second cross section, wherein the third portion is in contact with the fourth semiconductor region and the fifth semiconductor region in the third direction in the first cross section, and the third portion is in contact with the sixth semiconductor region and the fifth semiconductor region in the third direction in the second cross section, wherein a thickness of the third portion provided between the fourth semiconductor region and the fifth semiconductor region in the third direction is smaller than a thickness of the first portion provided between the fourth semiconductor region and the fifth semiconductor region in the third direction, and wherein the thickness of the third portion provided between the fourth semiconductor region and the fifth semiconductor region in the third direction is smaller than a thickness of the second portion provided between the fourth semiconductor region and the fifth semiconductor region in the third direction.

2. The semiconductor device according to claim 1, wherein the fifth semiconductor region includes a fourth portion in contact with the first trench and provided between the second semiconductor region and the first portion, a fifth portion in contact with the second trench and provided between the second semiconductor region and the second portion, and a sixth portion in contact with the at least one third trench and provided between the second semiconductor region and the third portion,
wherein a thickness of the sixth portion in the third direction is larger than a thickness of the fourth portion in the third direction, and
wherein the thickness of the sixth portion in the third direction is larger than a thickness of the fifth portion in the third direction.

3. The semiconductor device according to claim 1, wherein the fifth semiconductor region includes a fourth portion in contact with the first trench and provided between the second semiconductor region and the first portion, a fifth portion in contact with the second trench and provided between the second semiconductor region and the second portion, and a sixth portion in contact with the at least one third trench and provided between the second semiconductor region and the third portion, and
wherein a second conductivity type impurity concentration of the sixth portion is higher than a second conductivity type impurity concentration of the fourth portion, and the second conductivity type impurity concentration of the sixth portion is higher than a second conductivity type impurity concentration of the fifth portion.

4. The semiconductor device according to claim 1, wherein the at least one third trench includes paired third trenches adjacent to each other, and the third portion is located between the paired third trenches.

5. The semiconductor device according to claim 1, wherein the thickness of the third portion in the direction from the first face toward the second face is equal to or less than 70% of the thickness of the first portion in the direction, and
wherein the thickness of the third portion in the third direction is equal to or less than 70% of the thickness of the second portion in the third direction.

6. The semiconductor device according to claim 1, wherein the first electrode pad is configured to receive a first turn-on voltage,
wherein the second electrode pad is configured to receive a second turn-on voltage,
wherein the third electrode pad is configured to receive a third turn-on voltage,
wherein, the third electrode pad is configured to receive a third turn-off voltage after the first electrode pad received the first turn-on voltage, after the second electrode pad received the second turn-on voltage, and after the third electrode pad received the third turn-on voltage,
wherein, the second electrode pad is configured to receive a second turn-off voltage after the third electrode pad received the third turn-off voltage, and
wherein, the first electrode pad is configured to receive the first turn-off voltage after the second electrode pad received the second turn-off voltage.

7. The semiconductor device according to claim 1, wherein the at least one third trench includes a plurality of trenches adjacent to each other in a second direction perpendicular to the first direction and parallel to the first face, one trench positioned at one end in the second direction among the plurality of trenches is in contact with the first portion or the second portion, and the other trench positioned at the other end in the second direction among the plurality of trenches is in contact with the first portion or the second portion.

8. The semiconductor device according to claim 1, wherein, in the first cross section, the fourth semiconductor region provided between two neighboring trenches in a second direction parallel to the first face is in contact with the two neighboring trenches, the fourth semiconductor region is continuous between the two neighboring trenches in the second direction, and each of the two neighboring trenches is one of the first trench, the second trench, or the at least one third trench.

9. A semiconductor circuit comprising:
the semiconductor device according to claim 1; and
a control circuit configured to drive the semiconductor device, the control circuit being connected to the first electrode pad, the second electrode pad, and the third electrode pad,
the control circuit configured to apply a first turn-on voltage to the first electrode pad,
the control circuit configured to apply a second turn-on voltage to the second electrode pad,
the control circuit configured to apply a third turn-on voltage to the third electrode pad,
the control circuit configured to apply a third turn-off voltage to the third electrode pad, after an application of the first turn-on voltage to the first electrode pad, after an application of the second turn-on voltage to the second electrode pad, and after an application of the third turn-on voltage to the third electrode pad,
the control circuit configured to apply a second turn-off voltage to the second electrode pad after an application of the third turn-off voltage to the third electrode pad, and
the control circuit configured to apply a first turn-off voltage to the first electrode pad after an application of the second turn-off voltage to the second electrode pad.

10. A semiconductor device comprising:
a semiconductor layer including a first face and a second face opposed to the first face;
a first semiconductor region of a first conductivity type provided in the semiconductor layer;
a second semiconductor region of a second conductivity type provided in the semiconductor layer and provided between the first semiconductor region and the first face;
a third semiconductor region of the first conductivity type provided in the semiconductor layer and provided between the second semiconductor region and the first face;
a fourth semiconductor region of the second conductivity type provided in the semiconductor layer and provided between the third semiconductor region and the first face;
a fifth semiconductor region of the second conductivity type provided in the semiconductor layer, provided between the second semiconductor region and the third semiconductor region, and having a higher second conductivity type impurity concentration than a second conductivity type impurity concentration of the second semiconductor region;

a sixth semiconductor region of the first conductivity type provided in the semiconductor layer, provided between the third semiconductor region and the first face, and having a higher first conductivity type impurity concentration than a first conductivity type impurity concentration of the third semiconductor region;

a first trench provided in the semiconductor layer on a side of the first face, the first trench extending in a first direction parallel to the first face, and being in contact with the second semiconductor region, the third semiconductor region, the fourth semiconductor region, the fifth semiconductor region, and the sixth semiconductor region;

a first gate electrode provided in the first trench;

a first gate insulating film provided between the first gate electrode and the second semiconductor region, between the first gate electrode and the third semiconductor region, between the first gate electrode and the fourth semiconductor region, between the first gate electrode and the fifth semiconductor region, and between the first gate electrode and the sixth semiconductor region;

a second trench provided in the semiconductor layer on the side of the first face, the second trench extending in the first direction, and being in contact with the second semiconductor region, the third semiconductor region, the fourth semiconductor region, the fifth semiconductor region, and the sixth semiconductor region;

a second gate electrode provided in the second trench;

a second gate insulating film provided between the second gate electrode and the second semiconductor region, between the second gate electrode and the third semiconductor region, between the second gate electrode and the fourth semiconductor region, between the second gate electrode and the fifth semiconductor region, and between the second gate electrode and the sixth semiconductor region;

at least one third trench provided in the semiconductor layer on the side of the first face, the at least one third trench extending in the first direction, and being in contact with the second semiconductor region, the third semiconductor region, the fourth semiconductor region, the fifth semiconductor region, and the sixth semiconductor region;

a third gate electrode provided in the at least one third trench;

a third gate insulating film provided between the third gate electrode and the second semiconductor region, between the third gate electrode and the third semiconductor region, between the third gate electrode and the fourth semiconductor region, between the third gate electrode and the fifth semiconductor region, and between the third gate electrode and the sixth semiconductor region;

a first electrode provided on the semiconductor layer on the side of the first face and in contact with the fourth semiconductor region;

a second electrode provided on the semiconductor layer on a side of the second face and in contact with the first semiconductor region;

a first electrode pad provided on the semiconductor layer on the side of the first face and electrically connected to the first gate electrode;

a second electrode pad provided on the semiconductor layer on the side of the first face and electrically connected to the second gate electrode; and a third electrode pad provided on the semiconductor layer on the side of the first face and electrically connected to the third gate electrode, wherein the sixth semiconductor region provided in the first direction of the fourth semiconductor region, and the sixth semiconductor region is in contact with the fourth semiconductor region in the first direction, wherein in a first cross section perpendicular to the first direction and including the fourth semiconductor region, the fourth semiconductor region is in contact with the first trench, the second trench, and the at least one third trench, wherein in a second cross section perpendicular to the first direction and including the sixth semiconductor region, the sixth semiconductor region is in contact with the first trench, the second trench, and the at least one third trench, wherein the third semiconductor region includes a first portion in contact with the first trench, a second portion in contact with the second trench, and a third portion in contact with the at least one third trench, wherein the first portion is in contact with the fourth semiconductor region and the fifth semiconductor region in a third direction from the first face toward the second face in the first cross section, and the first portion is in contact with the sixth semiconductor region and the fifth semiconductor region in the third direction in the second cross section, wherein the second portion is in contact with the fourth semiconductor region and the fifth semiconductor region in the third direction in the first cross section, and the second portion is in contact with the sixth semiconductor region and the fifth semiconductor region in the third direction in the second cross section, wherein the third portion is in contact with the fourth semiconductor region and the fifth semiconductor region in the third direction in the first cross section, and the third portion is in contact with the sixth semiconductor region and the fifth semiconductor region in the third direction in the second cross section, wherein a first conductivity type impurity concentration of the third portion provided between the fourth semiconductor region and the fifth semiconductor region in the third direction is lower than a first conductivity type impurity concentration of the first portion provided between the fourth semiconductor region and the fifth semiconductor region in the third direction, and wherein the first conductivity type impurity concentration of the third portion provided between the fourth semiconductor region and the fifth semiconductor region in the third direction is lower than a first conductivity type impurity concentration of the second portion provided between the fourth semiconductor region and the fifth semiconductor region in the third direction.

11. The semiconductor device according to claim 10, wherein the first conductivity type impurity concentration of the third portion is equal to or less than 80% of the first conductivity type impurity concentration of the first portion, and wherein the first conductivity type impurity concentration of the third portion is equal to or less than 80% of the first conductivity type impurity concentration of the second portion.

12. The semiconductor device according to claim 10, wherein the first electrode pad is configured to receive a first turn-on voltage, wherein the second electrode pad is configured to receive a second turn-on voltage, wherein the third electrode pad is configured to receive a third turn-on voltage, wherein, the third electrode pad is configured to receive a third turn-off voltage after the first electrode pad received the first turn-on voltage, after the second electrode pad received the second turn-on voltage, and after the third electrode pad received the third turn-on voltage, wherein, the second electrode pad is configured to receive a second turn-off voltage after the third electrode pad received the third turn-off voltage, and wherein, the first electrode pad is configured to receive the first turn-off voltage after the second electrode pad received the second turn-off voltage.

13. The semiconductor device according to claim 10, wherein the at least one third trench includes a plurality of trenches adjacent to each other in a second direction perpendicular to the first direction and parallel to the first face, one trench positioned at one end in the second direction among the plurality of trenches is in contact with the first portion or the second portion, and the other trench positioned at the other end in the second direction among the plurality of trenches is in contact with the first portion or the second portion.

14. The semiconductor device according to claim 10, wherein, in the first cross section, the fourth semiconductor region provided between two neighboring trenches in a second direction parallel to the first face is in contact with the two neighboring trenches, the fourth semiconductor region is continuous between the two neighboring trenches in the second direction, and each of the two neighboring trenches is one of the first trench, the second trench, or the at least one third trench.

15. A semiconductor circuit comprising:
the semiconductor device according to claim 10; and
a control circuit configured to drive the semiconductor device, the control circuit being connected to the first electrode pad, the second electrode pad, and the third electrode pad,
the control circuit configured to apply a first turn-on voltage to the first electrode pad,
the control circuit configured to apply a second turn-on voltage to the second electrode pad,
the control circuit configured to apply a third turn-on voltage to the third electrode pad,
the control circuit configured to apply a third turn-off voltage to the third electrode pad, after an application of the first turn-on voltage to the first electrode pad, after an application of the second turn-on voltage to the second electrode pad, and after an application of the third turn-on voltage to the third electrode pad,
the control circuit configured to apply a second turn-off voltage to the second electrode pad after an application of the third turn-off voltage to the third electrode pad, and
the control circuit configured to apply a first turn-off voltage to the first electrode pad after an application of the second turn-off voltage to the second electrode pad.

16. A semiconductor device comprising:
a semiconductor layer including a first face and a second face opposed to the first face;
a first semiconductor region of a first conductivity type provided in the semiconductor layer;

a second semiconductor region of a second conductivity type provided in the semiconductor layer and provided between the first semiconductor region and the first face;
a third semiconductor region of the first conductivity type provided in the semiconductor layer and provided between the second semiconductor region and the first face;
a fourth semiconductor region of the second conductivity type provided in the semiconductor layer and provided between the third semiconductor region and the first face;
a fifth semiconductor region of the second conductivity type provided in the semiconductor layer, provided between the second semiconductor region and the third semiconductor region, provided between the second semiconductor region and the fourth semiconductor region in a direction from the first face toward the second face, and having a higher second conductivity type impurity concentration than a second conductivity type impurity concentration of the second semiconductor region;
a sixth semiconductor region of the first conductivity type provided in the semiconductor layer, provided between the third semiconductor region and the first face, and having a higher first conductivity type impurity concentration than a first conductivity type impurity concentration of the third semiconductor region;
a first trench provided in the semiconductor layer on a side of the first face, the first trench extending in a first direction parallel to the first face, and being in contact with the second semiconductor region, the third semiconductor region, the fourth semiconductor region, the fifth semiconductor region and the sixth semiconductor region;
a first gate electrode provided in the first trench;
a first gate insulating film provided between the first gate electrode and the second semiconductor region, between the first gate electrode and the third semiconductor region, between the first gate electrode and the fourth semiconductor region, between the first gate electrode and the fifth semiconductor region, and between the first gate electrode and the sixth semiconductor region;
a second trench provided in the semiconductor layer on the side of the first face, the second trench extending in the first direction, and being in contact with the second semiconductor region, the third semiconductor region, the fourth semiconductor region, the fifth semiconductor region, and the sixth semiconductor region;
a second gate electrode provided in the second trench;
a second gate insulating film provided between the second gate electrode and the second semiconductor region, between the second gate electrode and the third semiconductor region, between the second gate electrode and the fourth semiconductor region, between the second gate electrode and the fifth semiconductor region, and between the second gate electrode and the sixth semiconductor region;
at least one third trench provided in the semiconductor layer on the side of the first face, the at least one third trench extending in the first direction, and being in contact with the second semiconductor region, the third semiconductor region, the fourth semiconductor region, the fifth semiconductor region, and the sixth semiconductor region;

a third gate electrode provided in the at least one third trench;

a third gate insulating film provided between the third gate electrode and the second semiconductor region, between the third gate electrode and the third semiconductor region, between the third gate electrode and the fourth semiconductor region, between the third gate electrode and the fifth semiconductor region, and between the third gate electrode and the sixth semiconductor region;

a first electrode provided on the semiconductor layer on the side of the first face and in contact with the fourth semiconductor region;

a second electrode provided on the semiconductor layer on a side of the second face and in contact with the first semiconductor region;

a first electrode pad provided on the semiconductor layer on the side of the first face and electrically connected to the first gate electrode;

a second electrode pad provided on the semiconductor layer on the side of the first face and electrically connected to the second gate electrode; and a third electrode pad provided on the semiconductor layer on the side of the first face and electrically connected to the third gate electrode, wherein the sixth semiconductor region provided in the first direction of the fourth semiconductor region, and the sixth semiconductor region is in contact with the fourth semiconductor region in the first direction, wherein in a first cross section perpendicular to the first direction and including the fourth semiconductor region, the fourth semiconductor region is in contact with the first trench, the second trench, and the at least one third trench, wherein in a second cross section perpendicular to the first direction and including the sixth semiconductor region, the sixth semiconductor region is in contact with the first trench, the second trench, and the at least one third trench, wherein the fifth semiconductor region includes a fourth portion in contact with the first trench, a fifth portion in contact with the second trench, and a sixth portion in contact with the at least one third trench, wherein a second conductivity type impurity concentration of the sixth portion is higher than a second conductivity type impurity concentration of the fourth portion, and the second conductivity type impurity concentration of the sixth portion is higher than a second conductivity type impurity concentration of the fifth portion.

17. The semiconductor device according to claim 16, wherein the first electrode pad is configured to receive a first turn-on voltage, wherein the second electrode pad is configured to receive a second turn-on voltage, wherein the third electrode pad is configured to receive a third turn-on voltage, wherein, the third electrode pad is configured to receive a third turn-off voltage after the first electrode pad received the first turn-on voltage, after the second electrode pad received the second turn-on voltage, and after the third electrode pad received the third turn-on voltage, wherein, the second electrode pad is configured to receive a second turn-off voltage after the third electrode pad received the third turn-off voltage, and wherein, the first electrode pad is configured to receive the first turn-off voltage after the second electrode pad received the second turn-off voltage.

18. The semiconductor device according to claim 16, wherein the at least one third trench includes a plurality of trenches adjacent to each other in a second direction perpendicular to the first direction and parallel to the first face, one trench positioned at one end in the second direction among the plurality of trenches is in contact with the fourth portion or the fifth portion, and the other trench positioned at the other end in the second direction among the plurality of trenches is in contact with the fourth portion or the fifth portion.

19. The semiconductor device according to claim 16, wherein, in the first cross section, the fourth semiconductor region provided between two neighboring trenches in a second direction parallel to the first face is in contact with the two neighboring trenches, the fourth semiconductor region is continuous between the two neighboring trenches in the second direction, and each of the two neighboring trenches is one of the first trench, the second trench, or the at least one third trench.

20. A semiconductor circuit comprising:
the semiconductor device according to claim 16; and
a control circuit configured to drive the semiconductor device, the control circuit being connected to the first electrode pad, the second electrode pad, and the third electrode pad,
the control circuit configured to apply a first turn-on voltage to the first electrode pad,
the control circuit configured to apply a second turn-on voltage to the second electrode pad,
the control circuit configured to apply a third turn-on voltage to the third electrode pad,
the control circuit configured to apply a third turn-off voltage to the third electrode pad, after an application of the first turn-on voltage to the first electrode pad, after an application of the second turn-on voltage to the second electrode pad, and after an application of the third turn-on voltage to the third electrode pad,
the control circuit configured to apply a second turn-off voltage to the second electrode pad after an application of the third turn-off voltage to the third electrode pad, and
the control circuit configured to apply a first turn-off voltage to the first electrode pad after an application of the second turn-off voltage to the second electrode pad.

* * * * *